United States Patent [19]

Darwish et al.

[11] Patent Number: 5,688,725
[45] Date of Patent: Nov. 18, 1997

[54] METHOD OF MAKING A TRENCH MOSFET WITH HEAVILY DOPED DELTA LAYER TO PROVIDE LOW ON-RESISTANCE

[75] Inventors: Mohamed N. Darwish, Saratoga; Richard K. Williams, Cupertino, both of Calif.

[73] Assignee: Siliconix Incorporated, Santa Clara, Calif.

[21] Appl. No.: 482,357

[22] Filed: Jun. 6, 1995

Related U.S. Application Data

[62] Division of Ser. No. 367,027, Dec. 30, 1994, abandoned.

[51] Int. Cl.[6] .................. H01L 21/265; H01L 21/44; H01L 21/48
[52] U.S. Cl. .................................................. 438/270
[58] Field of Search .................. 437/40 DM, 41 DM, 437/203

[56] References Cited

U.S. PATENT DOCUMENTS

| | | | |
|---|---|---|---|
| 4,941,026 | 7/1990 | Temple | 357/23.4 |
| 5,341,011 | 8/1994 | Hshieh et al. | 257/330 |
| 5,424,231 | 6/1995 | Yang | 437/40 DM |
| 5,532,179 | 7/1996 | Chang et al. | 437/40 |
| 5,558,313 | 9/1996 | Hshieh et al. | 257/342 |

FOREIGN PATENT DOCUMENTS

| | | |
|---|---|---|
| 0 583 022 | 2/1994 | European Pat. Off. . |
| 0 583 028 | 2/1994 | European Pat. Off. . |
| 62 115873 | 5/1987 | Japan . |
| 92 14269 | 8/1992 | WIPO . |

*Primary Examiner*—John Niebling
*Assistant Examiner*—Brian K. Dutton
*Attorney, Agent, or Firm*—Skjerven, Morrill, MacPherson, Franklin & Friel; David E. Steuber

[57] ABSTRACT

In a vertical trench MOSFET, a layer of increased dopant concentration is formed in a lightly-doped or "drift" region which separates the body region from the drain region of the MOSFET. The layer of increased dopant concentration denominated a "delta" layer, operates to spread out the current as it emerges from the channel of the MOSFET and thereby reduces the resistance of the MOSFET when it is turned on.

16 Claims, 27 Drawing Sheets

0
METHOD OF MAKING A TRENCH MOSFET WITH HEAVILY DOPED DELTA LAYER TO PROVIDE LOW ON-RESISTANCE

This application is a division of application Ser. No. 08/367,027, filed Dec. 30, 1994, now abandoned.

CROSS-REFERENCE TO RELATED APPLICATION

This application is related to application Ser. No. 08/367,516 filed on even date herewith, now abandoned, which is incorporated herein by reference in its entirety.

FIELD OF THE INVENTION

This invention relates to current switching MOSFETs having a gate formed in a trench and in particular to a trench MOSFET having a lower resistance when the device is turned on.

BACKGROUND OF THE INVENTION

Power MOSFETs are widely used in numerous applications, including automotive electronics, disk drives and power supplies. Generally, these devices function as switches, and they are used to connect a power supply to a load. It is important that the resistance of the device be as low as possible when the switch is closed. Otherwise, power is wasted and excessive heat may be generated.

A common type of power MOSFET currently in use is a planar, double-diffused (DMOS) device, illustrated in the cross-sectional view of FIG. 1. An electron current flows laterally from N+ source regions 12 through channel regions formed within P-body regions 14 into an N-epitaxial layer 16. Current flow in the channel regions is controlled by a gate 18. After the current leaves the channel regions, it flows downward through N-epitaxial layer 16 into an N+ substrate 20, which forms the drain of the device. A parasitic junction field effect transistor (JFET) is formed by the existence of P-body regions 14 on either side of an intervening region of N-epitaxial layer 16. A depletion zone 22 adjacent the junction between each of P-body regions 14 and N-epitaxial layer 16 tends to squeeze the current and thereby increase the resistance in this area. As the current proceeds downward through N-epitaxial layer 16 it spreads out and the resistance decreases.

In an alternative form of vertical current flow device, the gate is formed in a "trench". Such a device is illustrated in FIG. 2A, which is a cross-sectional view of a single cell of a MOSFET 100, and in FIG. 2B, which is a plan view of the cell. Gates 102 and 104 are formed in trenches and surrounded by gate oxide layers 106 and 108, respectively. The trenched gate is often formed in a grid pattern (one section of which is shown in FIG. 2B), the grid representing a single interconnected gate, but a trench gate may also be formed as a series of distinct parallel stripes.

MOSFET 100 is a double-diffused device which is formed in an N-epitaxial layer 110. An N+ source region 112 is formed at the surface of epitaxial layer 110, as is a P+ contact region 114. A P-body 116 is located below N+ source region 112 and P+ contact region 114. A metal source contact 118 makes contact with the N+ source region 112 and shorts the N+ source region 112 to the P+ contact region 114 and P body 116.

The N-epitaxial layer 110 is formed on an N+ substrate 120, and a drain contact (not shown) is located at the bottom of the N+ substrate 120. The contact for the gates 102 and 104 is likewise not shown, but it is generally made by extending the conductive gate material outside of the trench and forming a metal contact at a location remote from the individual cells. The gate is typically made of polysilicon doped with phosphorus or boron.

A region 111 of N-epitaxial layer 110 between the N+ substrate 120 and the P body 116 is generally more lightly doped with N-type impurities than is N+ substrate 120. This increases the ability of MOSFET 100 to withstand high voltages. Region 111 is sometimes referred to as a "lightly doped" or "drift" region ("drift" referring to the movement of carriers in an electric field). Drift region 111 and N+ substrate 120 constitute the drain of MOSFET 100.

MOSFET 100 is an N-channel MOSFET. When a positive voltage is applied to gate 102, a channel region within P-body 116 adjacent the gate oxide 106 becomes inverted and, provided there is a voltage difference between the N+ source region 112 and the N+ substrate 120, an electron current will flow from the source region through the channel region into the drift region 111. In drift region 111, some of the electron current spreads diagonally at an angle until it hits the N+ substrate 120, and then it flows vertically to the drain. Other portions of the current flow straight down through the drift region 111, and some of the current flows underneath the gate 102 and then downward through the drift region 111.

The gate 102 is doped with a conductive material. Since MOSFET 100 is an N-channel MOSFET, gate 102 could be polysilicon doped with phosphorus. Gate 102 is insulated from the remainder of MOSFET 100 by the gate oxide 106. The thickness of gate oxide 106 is chosen to set the threshold voltage of MOSFET 100 and may also influence the breakdown voltage of MOSFET 100. The breakdown voltage of a power MOSFET such as MOSFET 100 would typically be no greater than 200 volts and more likely 60 volts or less.

One feature that makes the trench configuration attractive is that, as described above, the current flows vertically through the channel of the MOSFET. This permits a higher packing density than MOSFETs in which the current flows horizontally through the channel. Greater cell density generally means more MOSFETs per unit area of the substrate and, since the MOSFETs are connected in parallel, the on-resistance of the device is reduced.

In MOSFET 100 shown in FIG. 2A, the P+ contact region 114 is quite shallow and does not extend to the lower junction of the P-body region 116. This helps ensure that P-type dopant does not get into the channel region, where it would tend to increase the threshold voltage of the device and cause the turn-on characteristics of the device to vary from one run to another depending on the alignment of the P+ contact region 114. However, with a shallow P+ region 114, the device can withstand only relatively low voltages (e.g., 10 volts) when it is turned off. This is because the depletion spreading around the junction between P-body region 116 and drift region 111 does not adequately protect the corners of the trench (e.g., corner 122 shown in FIG. 1A). As a result, avalanche breakdown may occur in the vicinity of the trench, leading to a high generation rate of carriers which can charge or degrade the gate oxide 106 or even, in an extreme case, cause a rupture in the gate oxide 106. Thus the MOSFET 100 shown in FIG. 1B is at best a low voltage device.

FIG. 2C illustrates a modification of MOSFET 100 in which the P+ body contact region 114 is extended downward slightly beyond the lower junction of P-body region 116. The higher concentration of P ions in this region increases the size of the depletion area, and this provides some additional shielding around the corner 122 of the trench. However, if this device is pushed into breakdown, the generation of carriers will still most likely occur near gate oxide layer 106, and this could lead to the impairment of the gate oxide as described above.

The breakdown situation was significantly improved in the arrangement shown in FIGS. 3A–3C, which was described in U.S. Pat. No. 5,072,266 to Bulucea et al. In MOSFET 300, the P+ region 114 is extended downward below the bottom of the trench to form a deep, heavily-doped P region at the center of the cell. While this provides additional shielding at corner 122, the primary advantage is that carrier generation occurs primarily at the bottom tip 302 of the P+ region 114. This occurs because the electric field is strengthened beneath the tip 302, thereby causing carriers to be generated at that point or along the curvature of the junction rather than adjacent the gate oxide 106. This reduces the stress on gate oxide 106 and improves the reliability of MOSFET 300 under high voltage conditions, even though it may reduce the actual junction breakdown of the device.

FIG. 3B illustrates a perspective cross-sectional view of the left half of the cell shown in FIG. 3A, as well as portions of the adjoining cells. FIG. 3C shows a comparable P-channel device. FIG. 3D illustrates how a gate metal 121 may be used to form a connection with gates 102 and 104.

The deep central P+ region 114 in MOSFET 300, while greatly reducing the adverse consequences of breakdown, also has some unfavorable effects. First, an upward limit on cell density is created, because with increasing cell density P ions may be introduced into the channel region. As described above, this tends to increase the threshold voltage of the MOSFET. Second, the presence of a deep P+ region 114 tends to pinch the electron current as it leaves the channel and enters the drift region 111. In an embodiment which does not include a deep P+ region (as shown in, for example, FIG. 2A), the electron current spreads out when it reaches the drift region 111. This current spreading reduces the average current per unit area in the drift region 111 and therefore reduces the on-resistance of the MOSFET. The presence of a deep central P+ region limits this current spreading and increases the on-resistance consistent with high cell densities.

What is needed, therefore, is a MOSFET which combines the breakdown advantages of a deep central P+ region with a low on-resistance.

SUMMARY OF THE INVENTION

The trench MOSFET of this invention includes a gate formed in a trench, a source region of a first conductivity type, a body region of a second conductivity type located under the source region, a drain region of first conductivity type located under the body region, and a "lightly doped" or "drift" region within the drain region, the dopant concentration of the drift region being lower than the dopant concentration of the drain region generally. The drain may include a substrate or, in "quasi-vertical" embodiments, the drain may include a buried layer of first conductivity type which is connected to the top surface of the semiconductor material via, for example, a "sinker" region. The drift region may be formed in an epitaxial layer or in the substrate.

When the MOSFET is turned on, an electron current flows vertically through a channel within the body region adjacent the trench. To promote current spreading at the lower (drain) end of the channel region when the MOSFET is turned on, a "delta layer" is provided within the drift region. The delta layer is a layer wherein the concentration of dopant of first conductivity type is greater than the concentration of dopant of first conductivity type in the drift region generally. In many embodiments the delta layer abuts the body region, although in some embodiments the delta layer is separated from the body region.

The upper boundary of the delta layer is at a level which is above the bottom of the trench in which the gate is formed. In some embodiments, the upper boundary of the delta layer coincides with a lower junction of the body region. The lower boundary of the delta layer may be at a level either above or below the bottom of the trench.

The MOSFET is typically formed in a cell which is interposed between opposing trenches so as to form a symmetrical structure. In some embodiments, there is a gap between an end of the delta layer and the trench. In some embodiments, a region of second conductivity type extends downward through a central aperture in the delta layer. The delta layer may be formed in a MOSFET either with or without a deep central region of second conductivity type.

The delta layer constitutes a region of relatively low resistivity, as compared to the drift region generally, and therefore operates to spread out the current as it emerges from the lower (drain) end of the channel. This occurs without significant adverse effects on the breakdown characteristics of the MOSFET.

As used herein, terms which define physical direction or relationships, such as "under", "upper" or "bottom", are intended to refer to a MOSFET oriented as shown in FIGS. 3A–3C and 4, with the trench at the top surface of the device. It is understood that the MOSFET itself may be oriented in any manner.

BRIEF DESCRIPTION OF THE DRAWINGS

In the various figure of the drawing, like reference numerals are used to designate similar components.

DESCRIPTION OF THE INVENTION

Figure 3A:
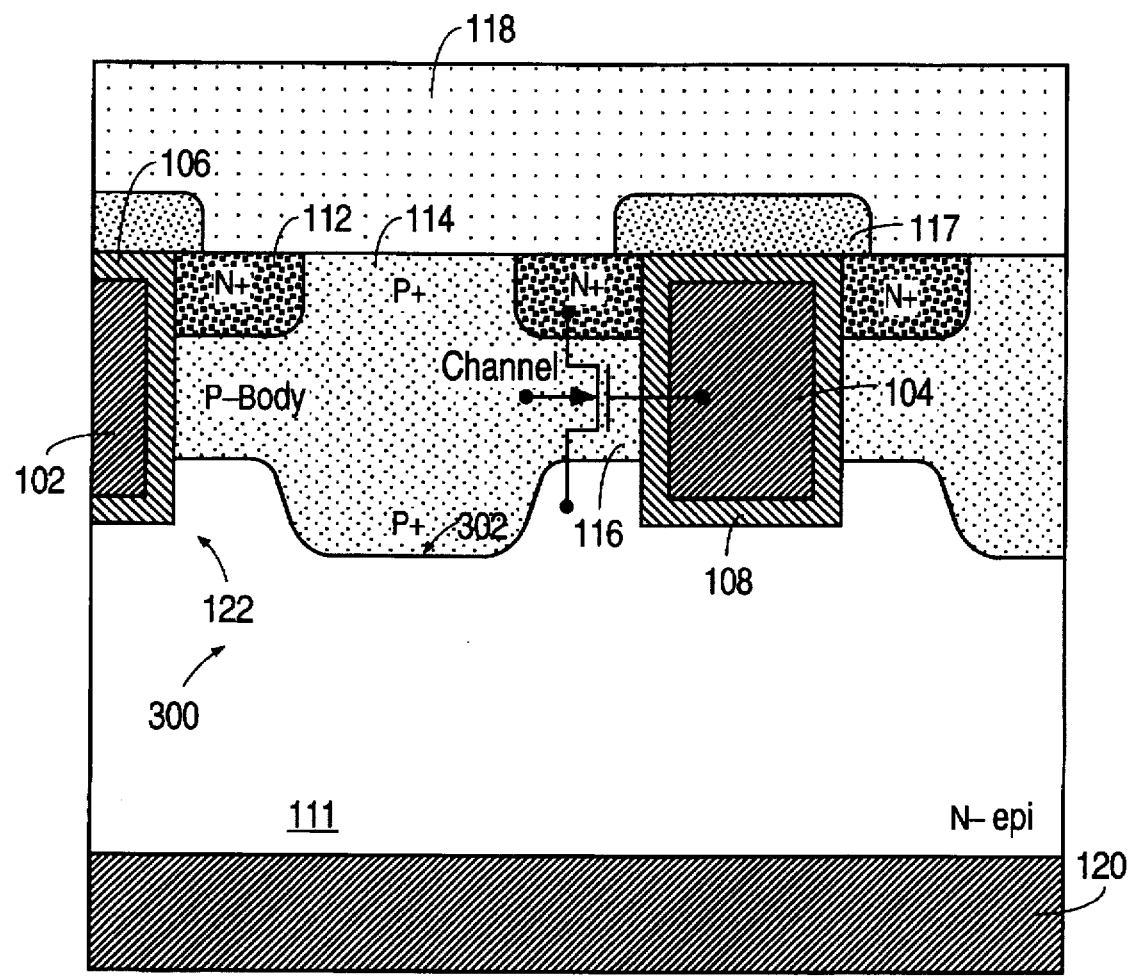
FIG. 3A illustrates a cross-sectional view of a conventional N-channel MOSFET in which the central P+ contact region has been extended to a location below the bottom of the trench.
Figure 3B:
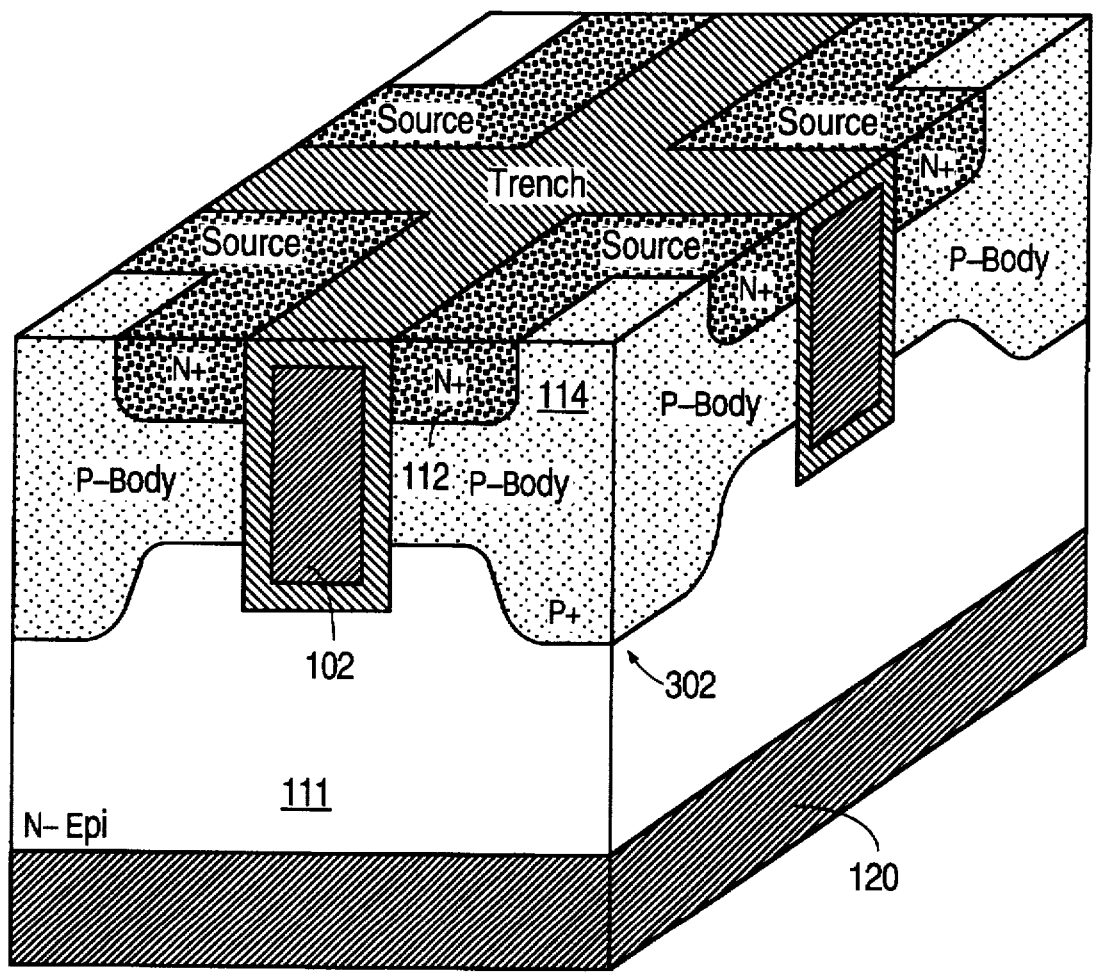
FIG. 3B illustrates a perspective cross-sectional view of the conventional N-channel MOSFET shown in FIG. 3A.
Figure 3C:
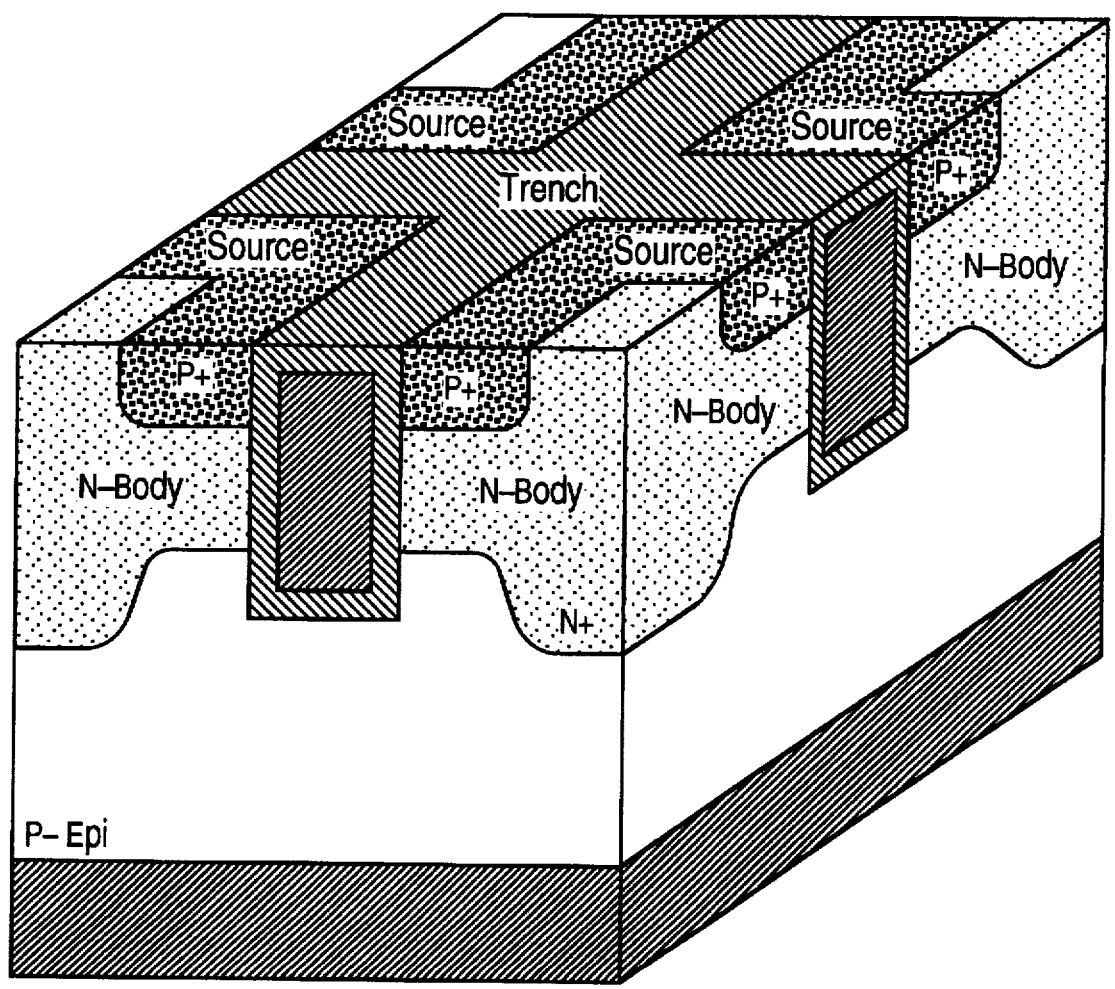
FIG. 3C illustrates a perspective cross-sectional view of a conventional P-channel MOSFET.
Figure 3D:
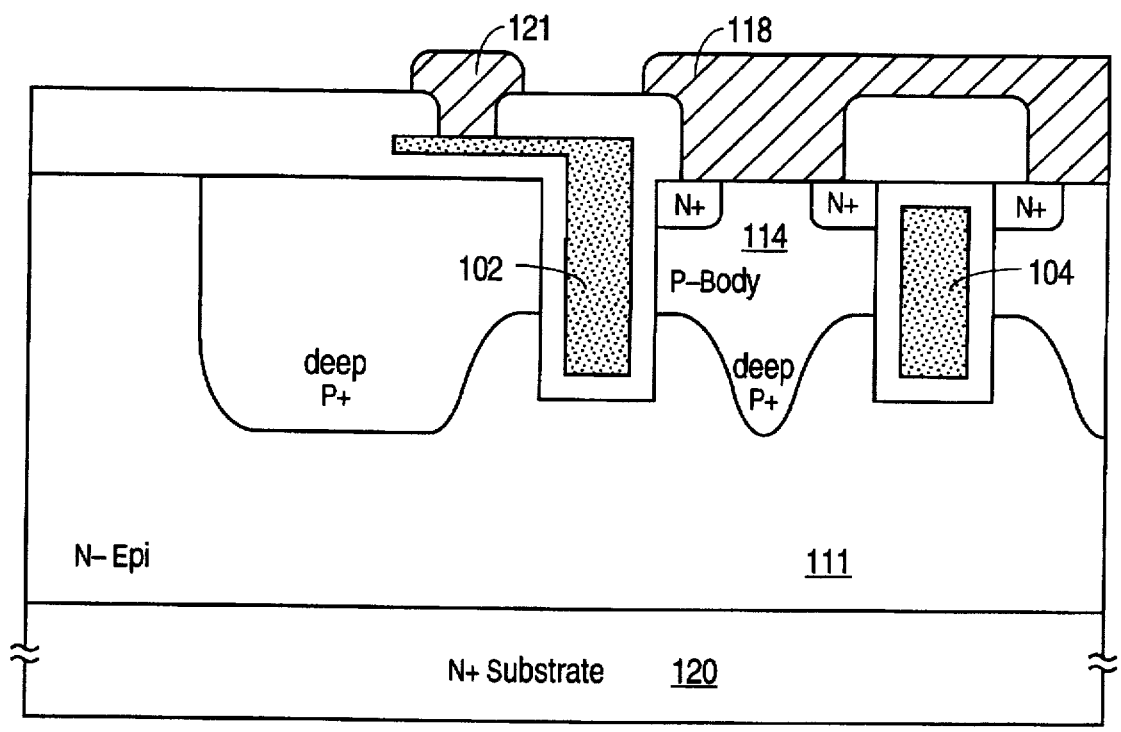
FIG. 3D illustrates a conventional gate metal contact formed on the top surface of the device.
Figure 4:
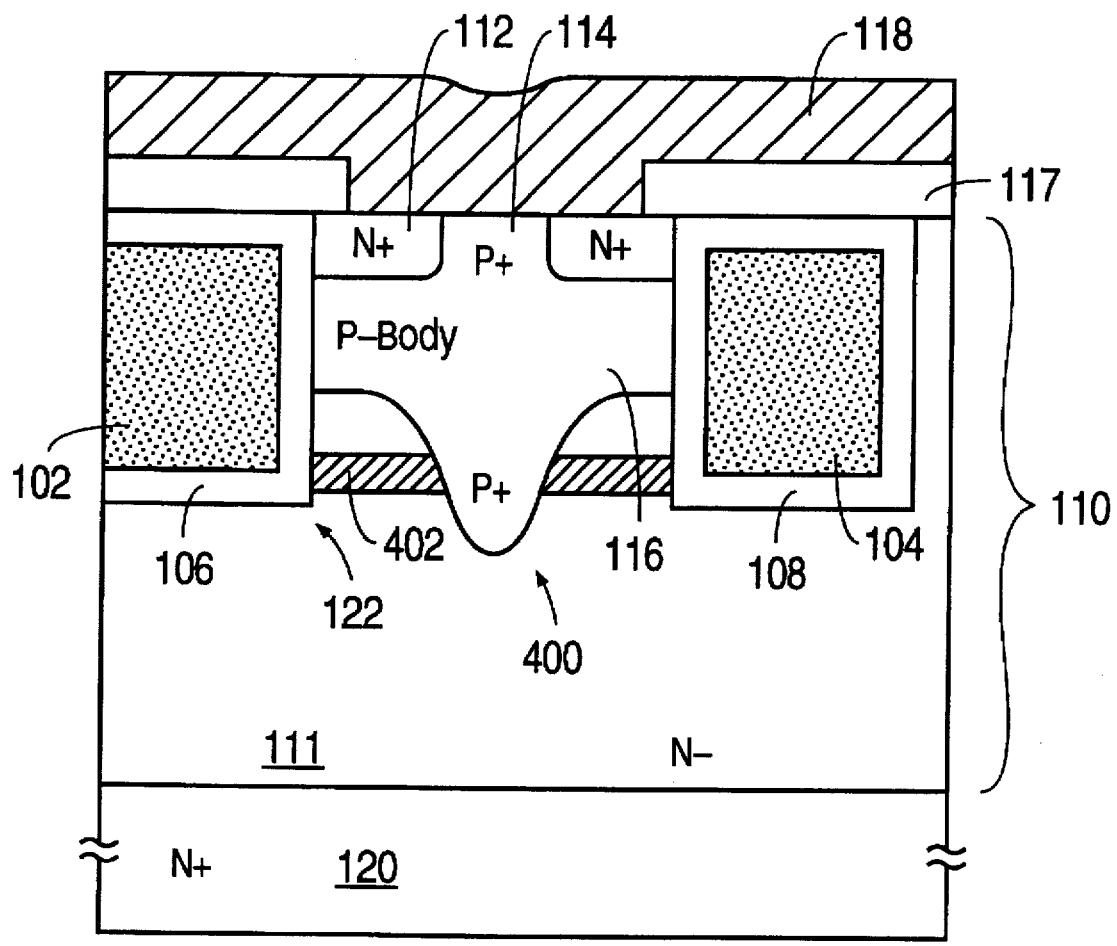
FIG. 4 illustrates a cross-sectional view of a MOSFET which includes a deep central P+ region as well as a N delta layer in accordance with this invention.

A MOSFET 400 in accordance with this invention is illustrated in FIG. 4. MOSFET 400 generally corresponds to MOSFET 300 shown in FIG. 3A, but in addition a delta layer 402 is located in N-epitaxial layer 110. N+ source region 112 would normally be highly doped with a dosage of from $1 \times 10^{14}$ to $7 \times 10^{15}$ cm$^{-2}$. P+ contact region 114 could be doped from $1 \times 10^{14}$ to $5 \times 10^{15}$ cm$^{-2}$. Along with the gate oxide thickness, the doping of P body 116 establishes the threshold voltage. P body 116 is normally doped in the range of from $5 \times 10^{12}$ to $5 \times 10^{14}$ cm$^2$. The trench in which gate 102 and gate oxide 106 are formed may be rectangular as shown, but it need not be. The thickness of the gate oxide 106 would typically be in the range of from 80 Å to 1200 Å. N delta layer 402 is doped with N-type dopant to a concentration that is greater than the concentration of N-type dopant in the adjacent portions of drift region 111. The dopant concentration of drift region 111 is typically in the range of $5 \times 10^{14}$ to $1 \times 10^{17}$ cm$^{-3}$ and the dopant concentration of N+ substrate 120 in the range of $5 \times 10^{17}$ to $1 \times 10^{20}$ cm$^{-3}$.

Figure 5:
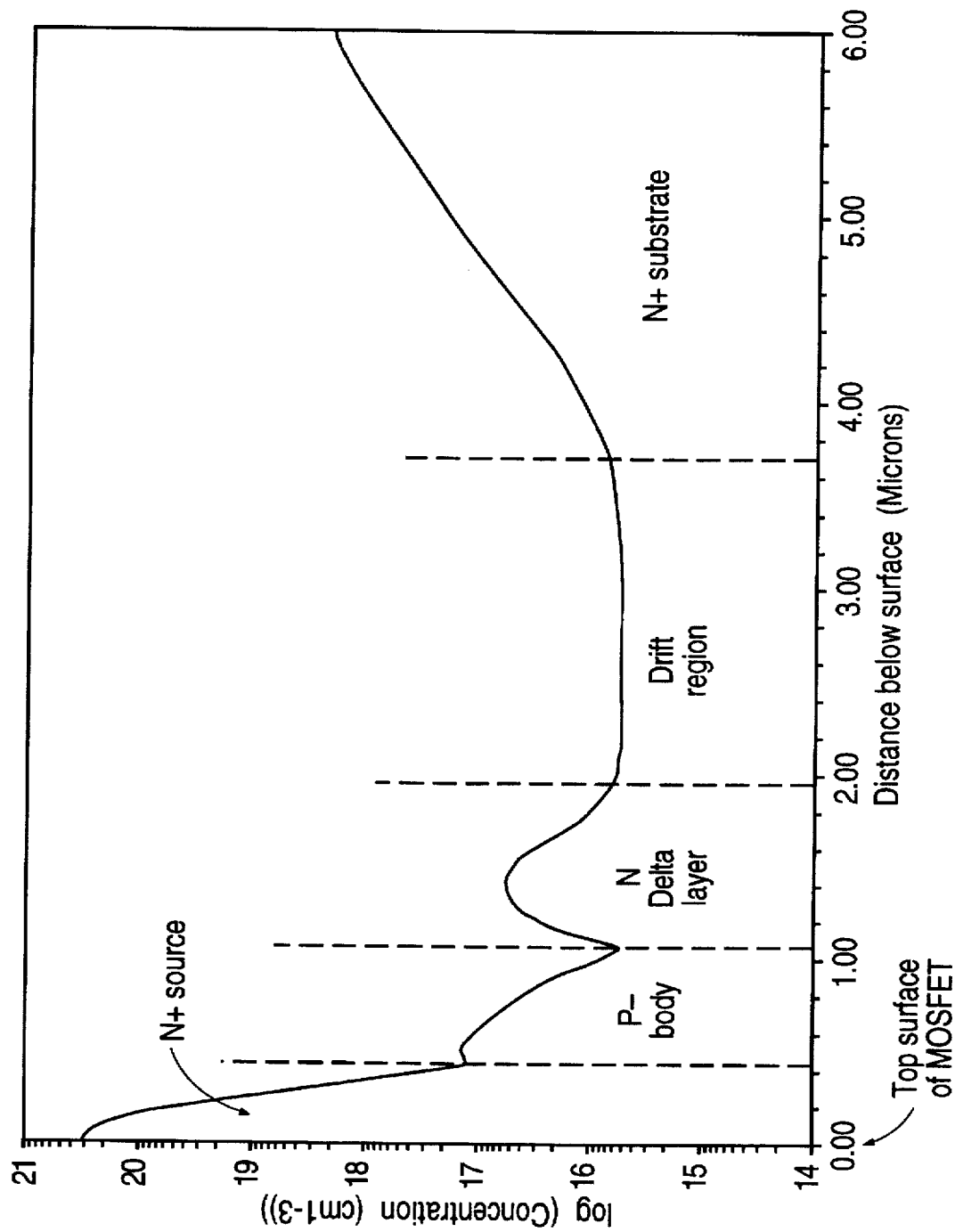
FIG. 5 illustrates a graph showing the concentration of dopant at different levels of the MOSFET fabricated in accordance with the principles of the invention.

FIG. 5 shows a graph which illustrates an example of the dopant concentrations in MOSFET 400. The horizontal axis of the graph represents the distance in microns below the surface of the MOSFET, and the vertical axis represents the concentration of dopant in ions-cm$^{-3}$. As indicated, the dopant concentration in the N delta layer 402 reaches a maximum at approximately $4 \times 10^{16}$ cm$^{-3}$ and is generally higher than the concentration of N-type dopant in adjacent regions of the drift region 111 which, in this example, remains relatively constant at about $4 \times 10^{15}$ cm$^{-3}$.

N delta layer 402 has a lower resistivity than drift region 111 generally, and effectively causes the current to spread out as it leaves the bottom (drain) end of the channel region of MOSFET 400. This effect is evident from FIGS. 6A and 6B, which illustrate the results of a computer simulation using the two-dimensional device simulator MEDICI. In both cases, the MOSFET was a device having a cell width of 7 microns with a trench approximately 1.5 microns deep. The device shown in FIG. 6A is in the form of MOSFET 300 (FIG. 3); the device shown in FIG. 6B is in the form of MOSFET 400 (FIG. 4), which has a delta layer.

Figure 6A:
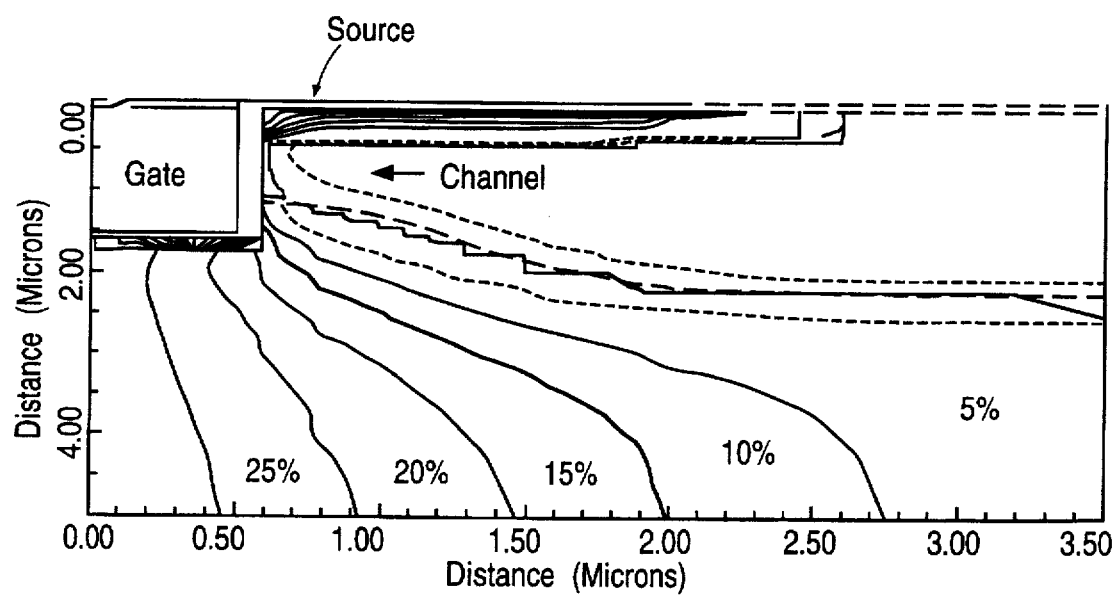
FIG. 6A illustrates the flow of current in a conventional MOSFET not fabricated in accordance with the principles of this invention.
Figure 6B:
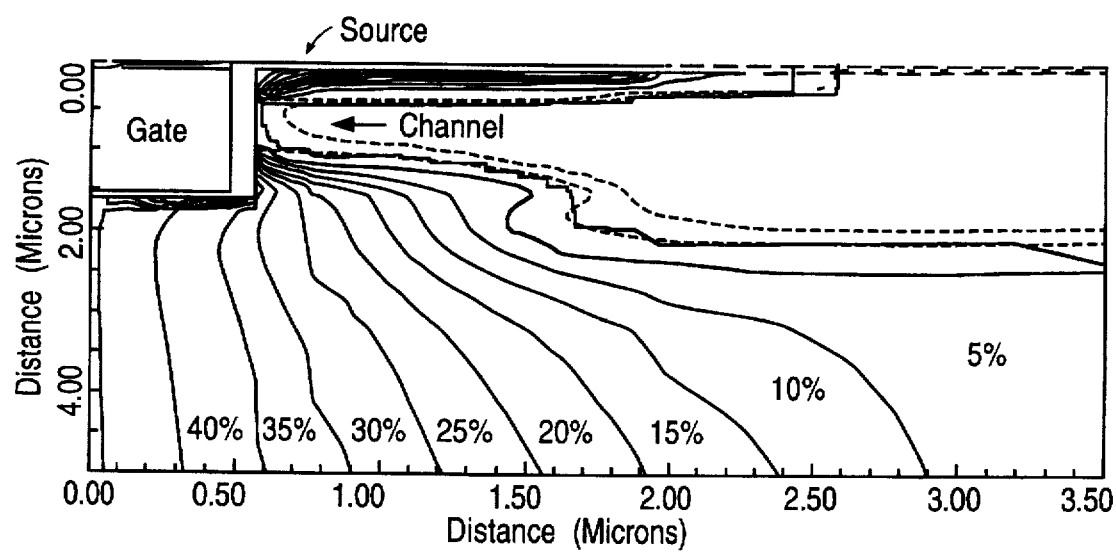
FIG. 6B illustrates the flow of current in a MOSFET fabricated in accordance with this invention.

The pattern of lines in FIGS. 6A and 6B illustrates the flow of current, the space between each pair of lines representing 5% of the total drain current. It is apparent from FIG. 6B that the current in MOSFET 400 fans out to a much greater degree after it leaves the drain end of the channel than does the current in MOSFET 300. For example, taking the right hand edge of the trench as a guide, it appears that approximately 38% of the current flows to the right of the trench in MOSFET 400, whereas only approximately 23% of the current in MOSFET 300 flows to the right of the trench. This results in a substantial improvement in on-resistance of MOSFET 400 illustrated in FIG. 6B. The on-resistance of MOSFET 400 is approximately 25% lower than the on-resistance of MOSFET 300.

Figure 7A:
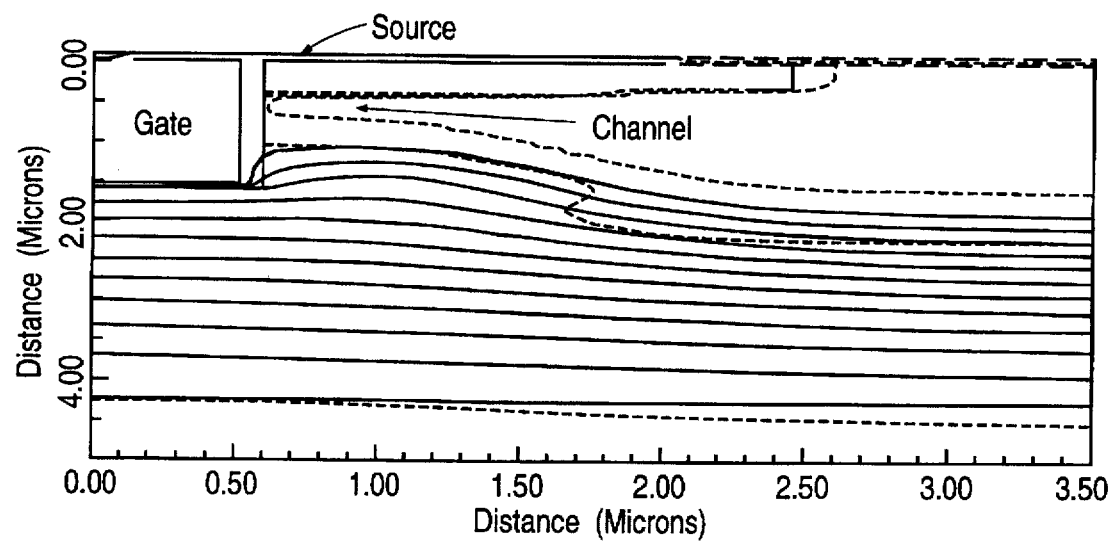
FIGS. 7A, 7B and 7C illustrate the equipotential lines, electric field contour lines and ionization rates, respectively, in a MOSFET fabricated in accordance with this invention.
Figure 7B:
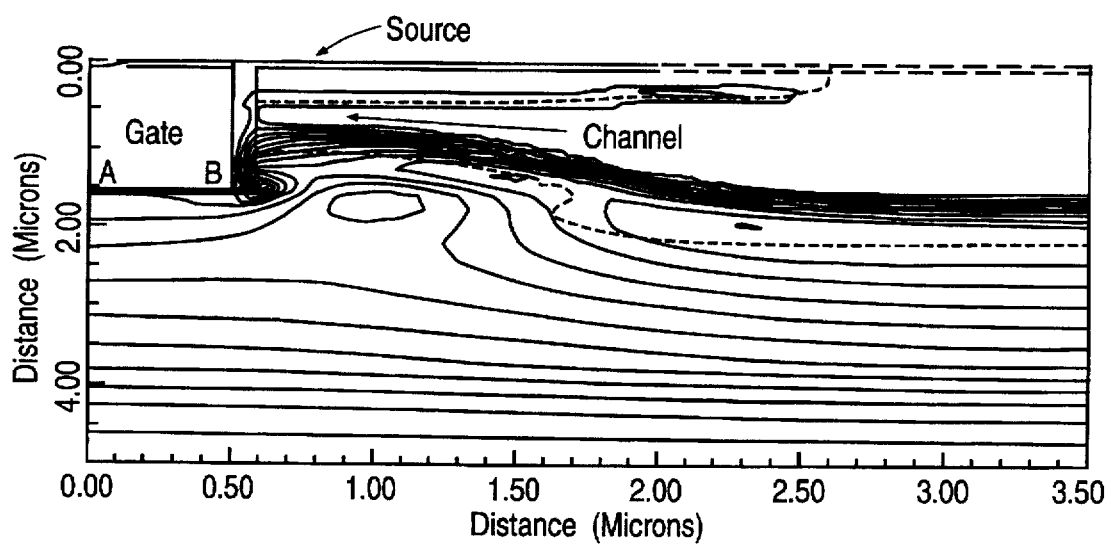
Figure 7C:
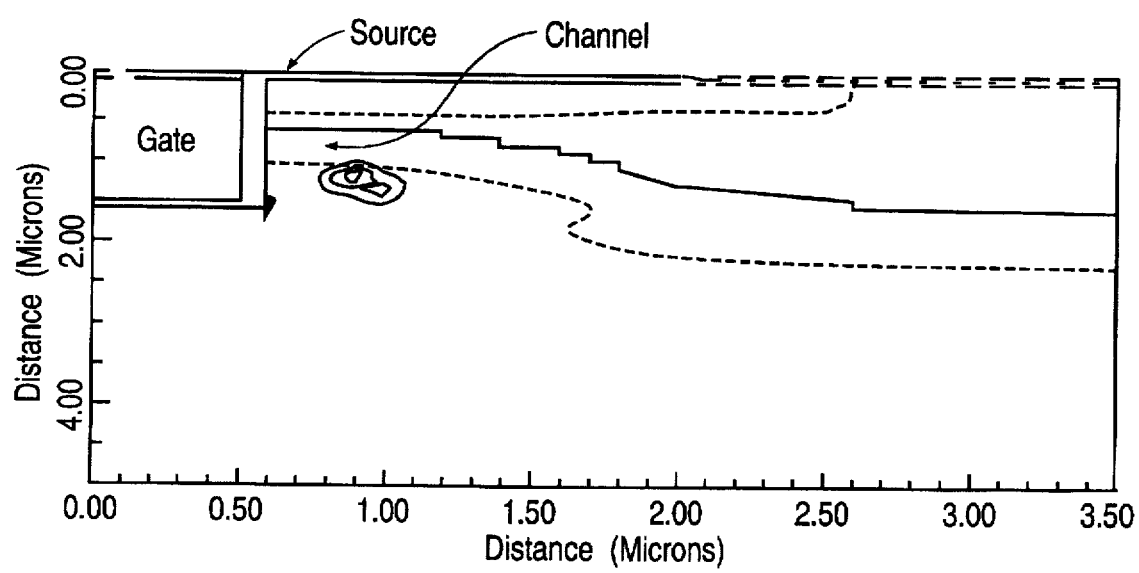

FIGS. 7A and 7B show simulated equipotential and electric field contour lines for MOSFET 400. FIG. 7C illustrates the ionization rates in the same device. In each of FIGS. 7A–7C the drain-to-source voltage $V_{DS}$ was 60 volts. In FIG. 7B, the electric field at the points designated A and B was 26.7 volts/micron and 35.3 volts/micron, respectively. FIG. 7C shows an ionization integral of 0.84 at the junction of P+ region 114 and drift region 110. This indicates that relatively few ions are generated adjacent the gate oxide and that the breakdown voltage of the device is not significantly affected by the presence of the delta layer.

Figure 8:
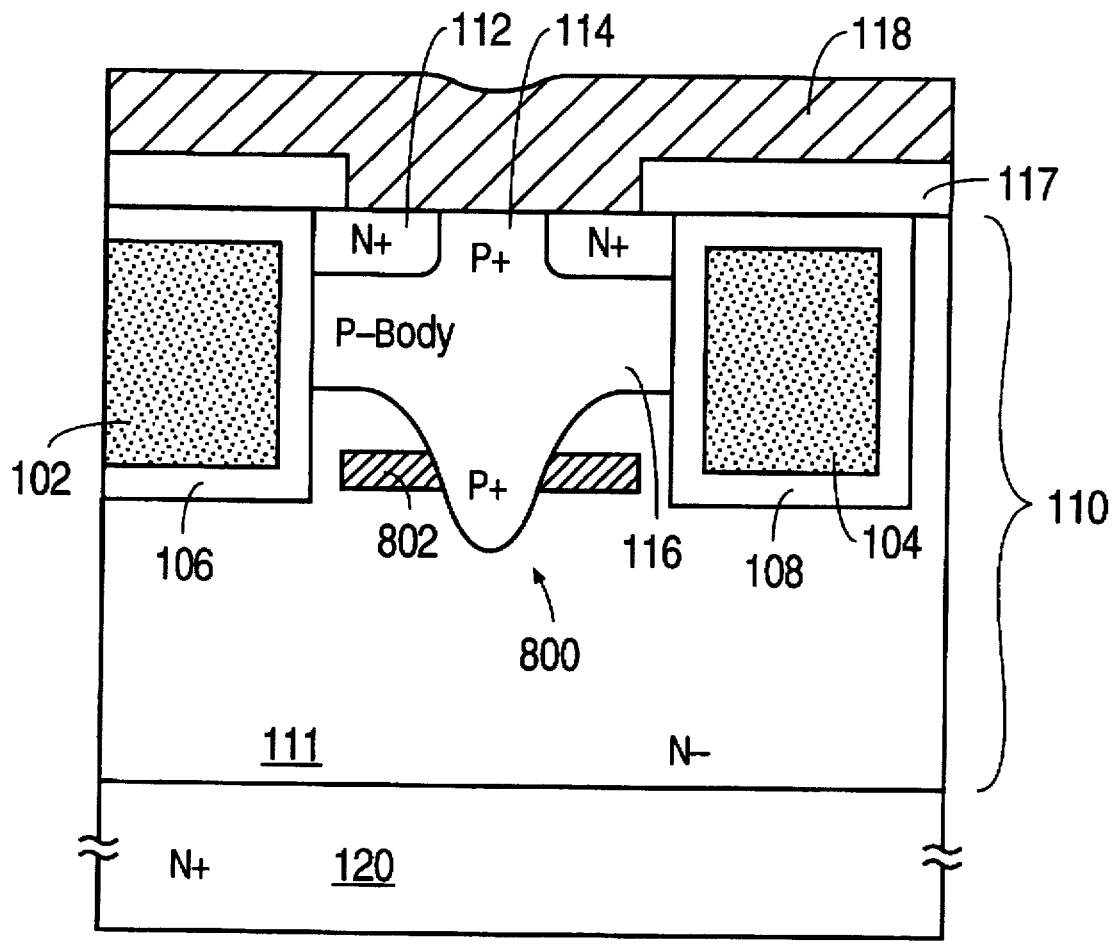
FIG. 8 illustrates a cross-sectional view of a MOSFET fabricated in accordance with the principles of this invention in which there is a gap between the edges of the delta layer and the walls of the trench.
Figure 9A:
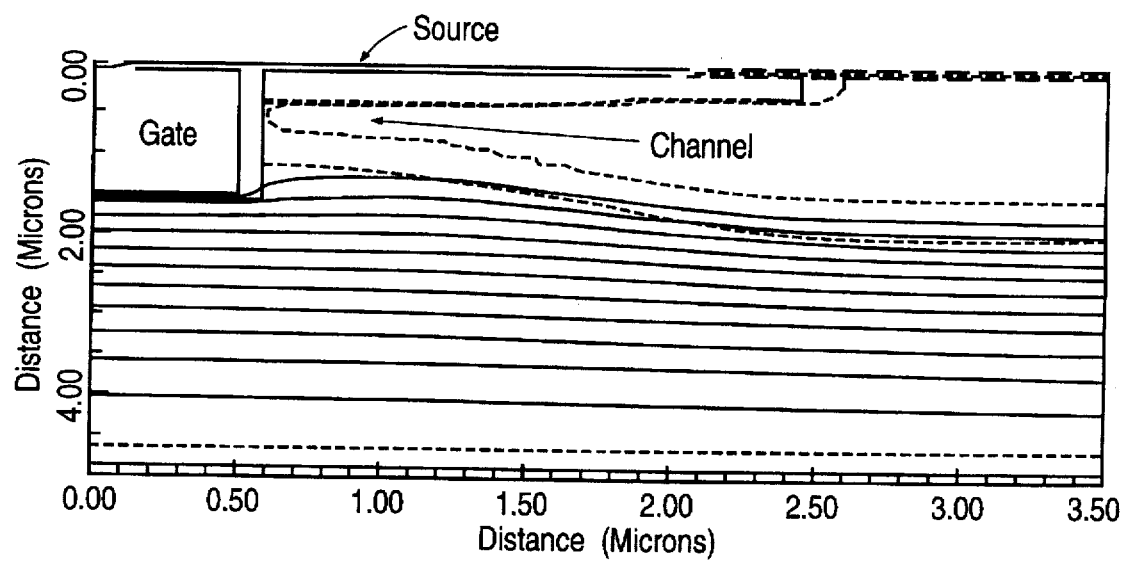
FIGS. 9A, 9B and 9C illustrate the equipotential lines, electric field contour lines and ionization rates for the MOSFET shown in FIG. 8.
Figure 9B:
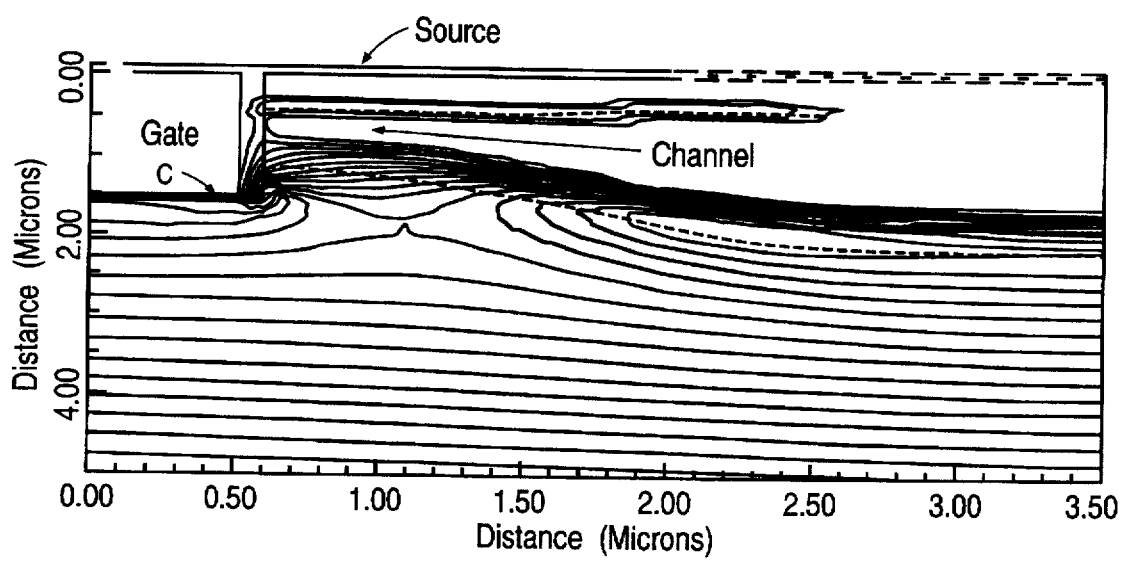
Figure 9C:
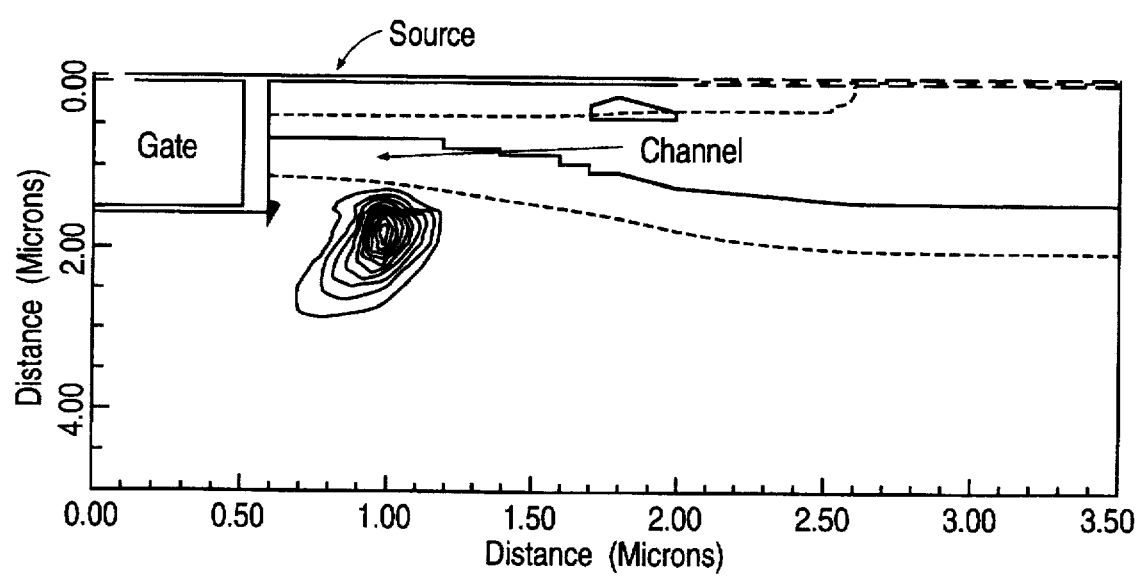

Alternatively, a MOSFET may be fabricated with a gap separating the delta layer from the trench. Such a configuration is shown in a MOSFET 800 in FIG. 8 wherein a gap separates an N delta layer 802 from the trenches in which gates 102 and 104 are formed. The operation of a MOSFET similar to MOSFET 800 was simulated, with a 2 micron gap between the end of the N delta layer and the trench. FIGS. 9A, 9B and 9C illustrate, respectively, the equipotential and electric field contour lines and the ionization rates for this device with $V_{DS}=60$ volts. With the MOSFET turned off, the electric field at the corner of the trench (designated C in FIG. 9B) was 33 volts/micron. Thus, providing a gap between the N delta layer and the edge of the trench appears to increase the breakdown voltage but the improvement in the on-resistance of the device is somewhat less, as compared to a device in which the delta layer extends to the edge of the trench. Nonetheless, the on-resistance is still approximately 10% less than a similar device without the delta layer.

Figure 10:
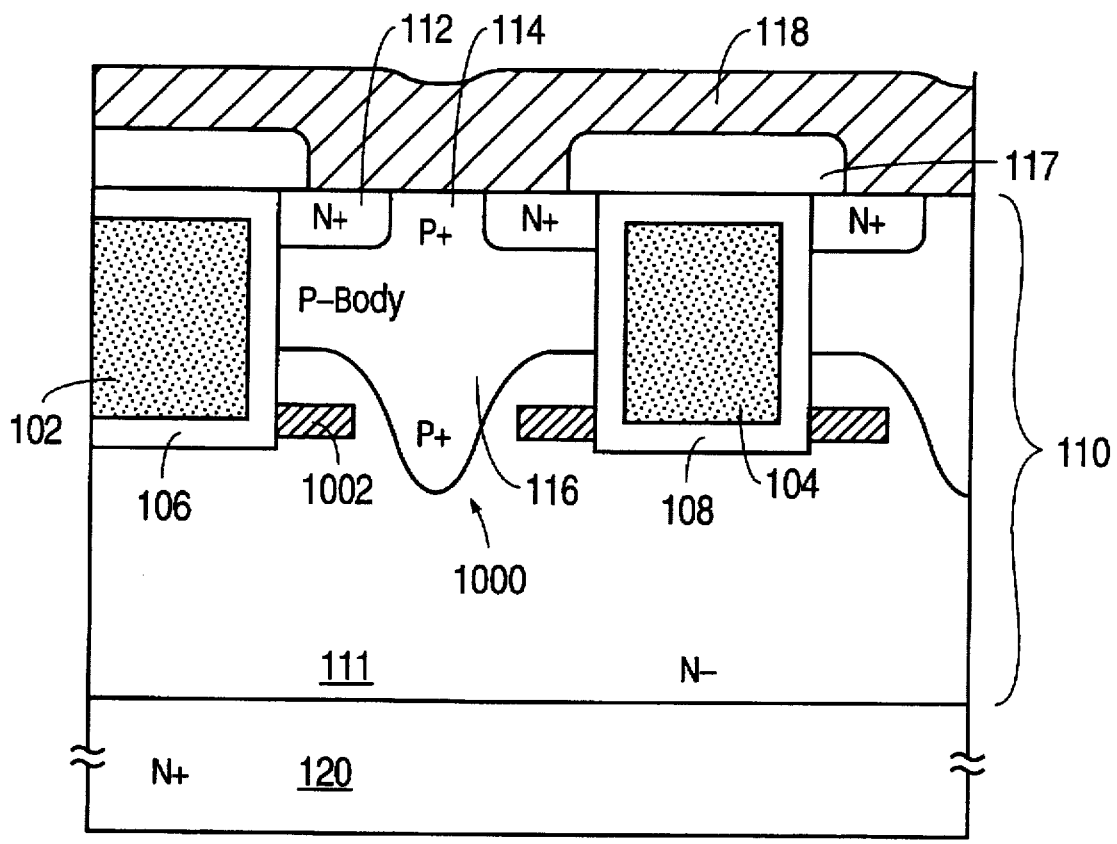
FIG. 10 illustrates a MOSFET in accordance with this invention in which there is a gap between the edges of the delta layer and a deep diffusion at the center of the cell.

Yet another embodiment is illustrated in FIG. 10, which shows a MOSFET 1000 having an N delta layer 1002. Delta layer 1002 is shaped in the form of an annulus, with a gap separating delta layer 1002 from P+ region 114. This structure has a higher on-resistance as compared to MOSFET 400 (FIG. 4), but since the total charge in the delta layer is less, the breakdown voltage appears to increase.

As used herein, the term "delta layer" means a layer beneath the body region in a trenched vertical MOSFET in which the dopant concentration is greater than the dopant concentration in a region immediately below the delta layer. The boundaries of the delta layer are located where the dopant concentration ceases to decrease (i.e., either remains the same or increases) or where the delta layer abuts the body region. The lower boundary of the delta layer may be located at a level which is either above or below the bottom of the trench, and which is either above or below the bottom of a region of opposite conductivity at the center of the cell. The upper boundary of the delta layer may coincide with the lower junction of the body region, or the upper boundary of the delta layer may be below the lower junction of the body region. The delta layer can be in an epitaxial layer or in the substrate (i.e., in some embodiments a lightly doped drift region could be formed in the substrate instead of an epitaxial layer).

Figure 1:
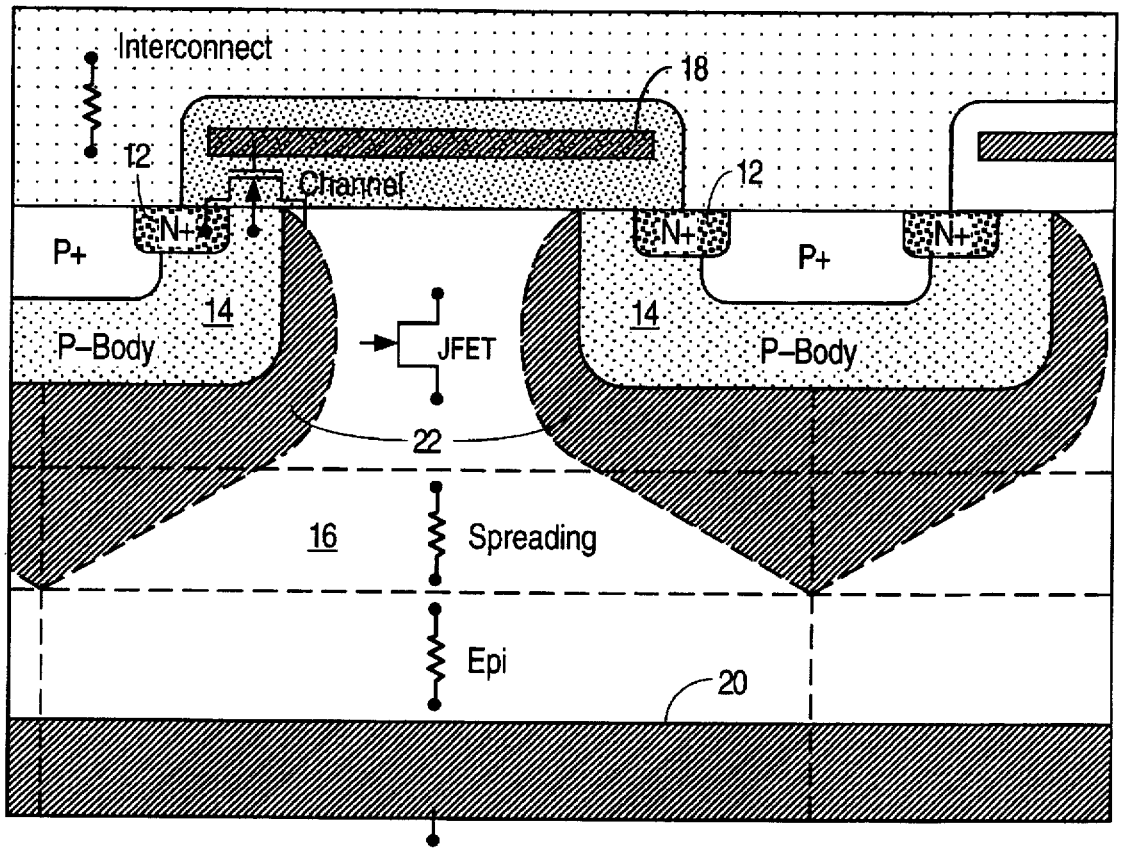
FIG. 1 illustrates a cross-sectional view of a conventional planar double-diffused MOSFET.
Figure 2A:
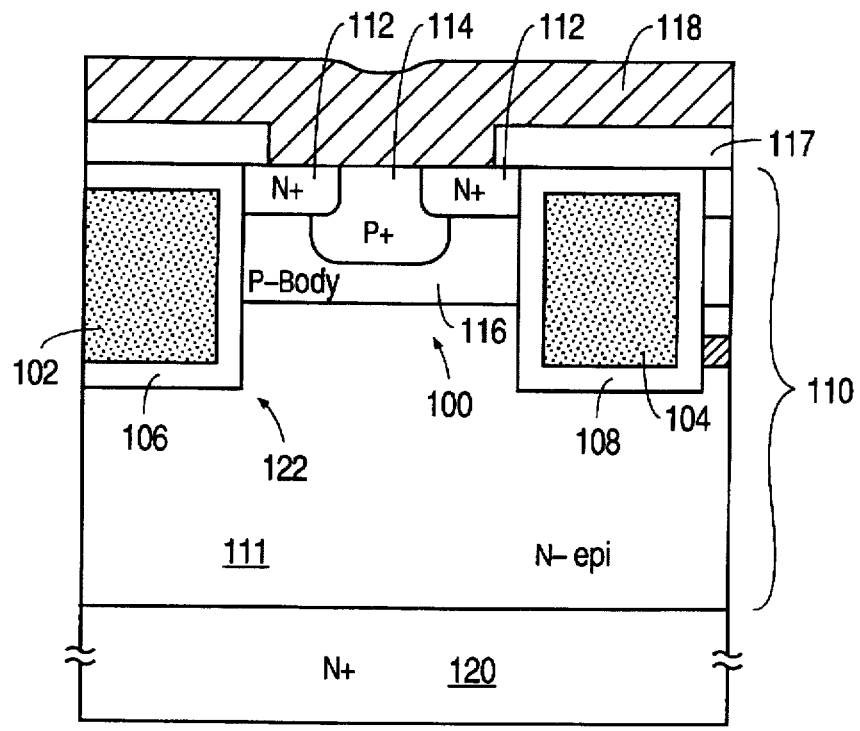
FIGS. 2A and 2B illustrate cross-sectional and plan views, respectively, of a cell of a conventional vertical trench N-channel MOSFET having a relatively shallow central P+ contact region.
Figure 2B:
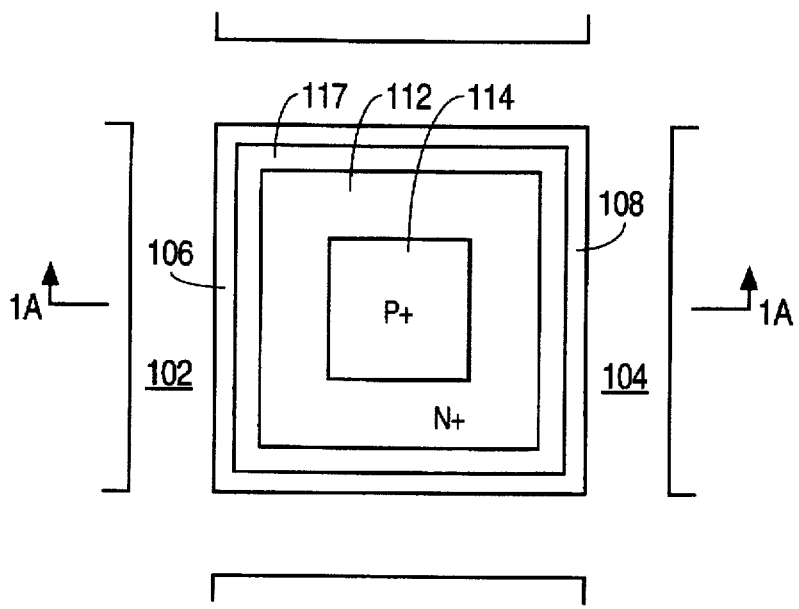
Figure 2C:
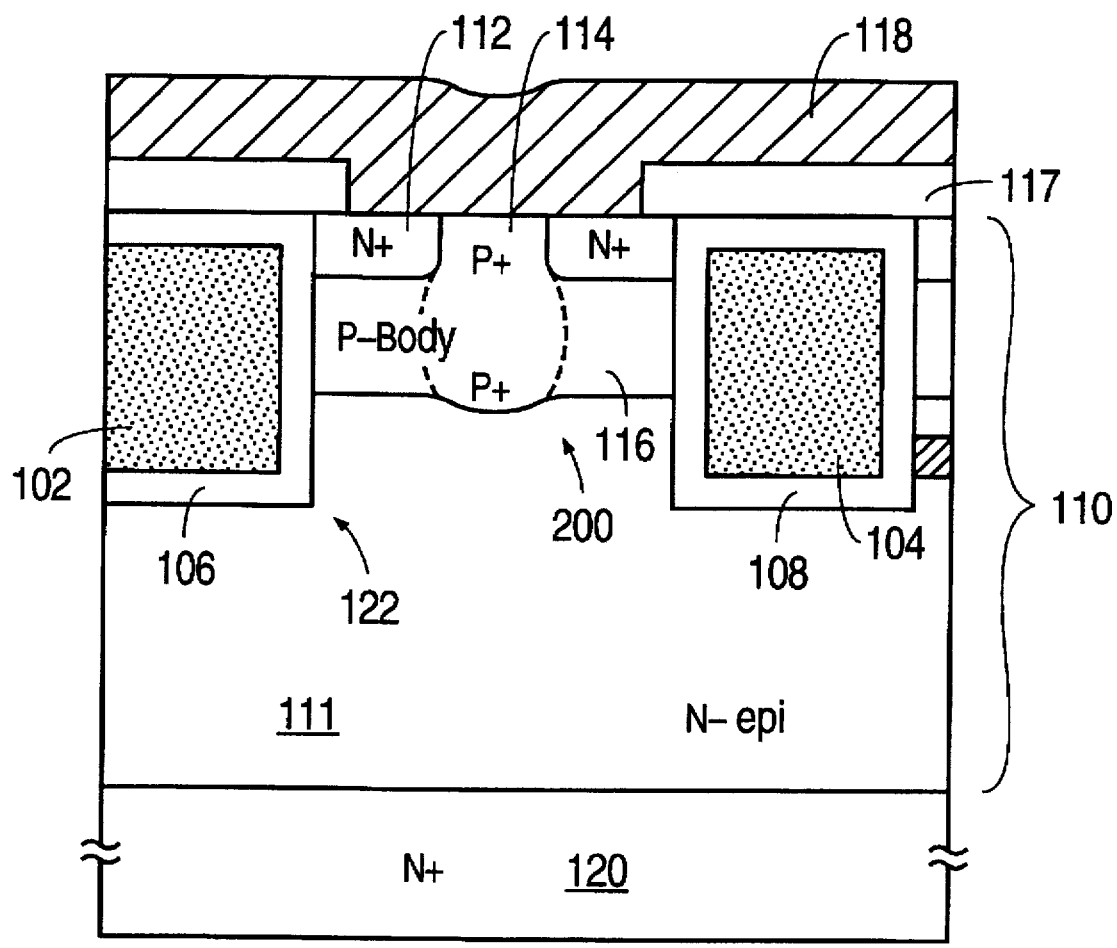
FIG. 2C illustrates a cross-sectional view of a conventional N-channel MOSFET in which the central P+ contact region has been extended below the bottom edge of the P body region.

Moreover, a delta layer may be provided in MOSFETs 100 and 200 (shown in FIGS. 2A and 2C, respectively), as well as numerous other vertical trench MOSFETs. The trench need not be rectangular in cross section but may be U- or V-shaped or may be some other shape (e.g., rectangular with rounded corners). While the principles of the invention have been illustrated with N-channel devices, a comparable P delta layer may be used in P-channel devices.

Although there are numerous processes for fabricating a MOSFET in accordance with this invention, FIGS. 11A–11G illustrate an exemplary process for fabricating MOSFET 400 shown in FIG. 4.

Figure 11A:
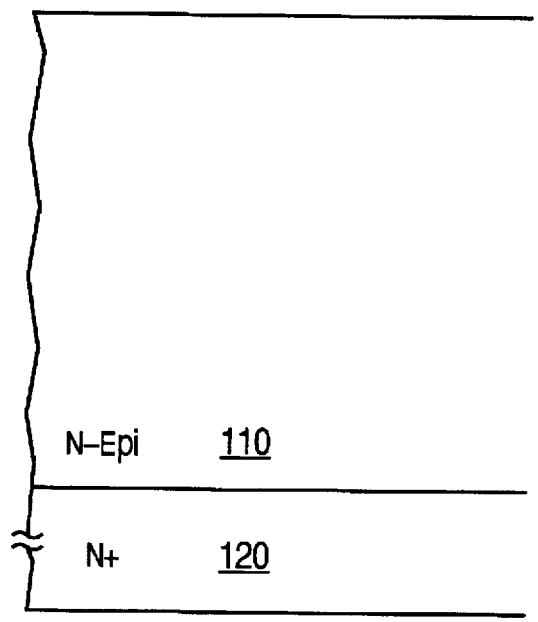
FIGS. 11A–11G illustrate steps in a process of fabricating a MOSFET in accordance with this invention.

As shown in FIG. 11A, the starting point is a conventional N+ substrate 120 on which an N-epitaxial layer 110 is grown using known processes.

Figure 11B:
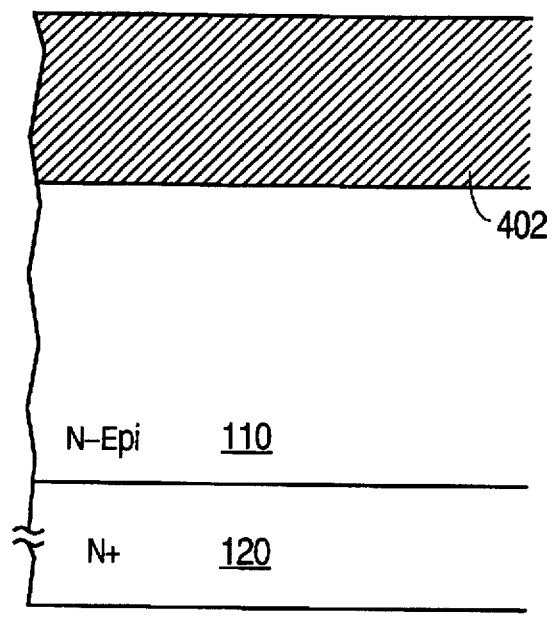

As shown in FIG. 11B, the N delta layer 402 is then implanted with N-type dopant through the top surface of N-epitaxial layer 110 at a dosage of from $1 \times 10^{13}$ cm$^{-2}$ to $2 \times 10^{14}$ cm$^{-2}$ at an energy in the range of 60–250 keV (e.g., arsenic at a dosage of $8 \times 10^{13}$ cm$^{-2}$ and 120 keV). While N delta layer 402 is illustrated as extending to the surface of epitaxial layer 110, the N-type dopant concentration in delta layer 402 is not uniform, even immediately after implantation. The peak concentration of N-type dopant is typically located at least 0.1 µm below the surface of epitaxial layer 110 so as to avoid counterdoping the body region (see below). The portion of N-epitaxial layer 110 below N delta layer 402 forms part of drift region 111. Alternatively, N delta layer 402 could be formed by adding additional N-type dopant as N-epitaxial layer 110 is grown.

Figure 11C:
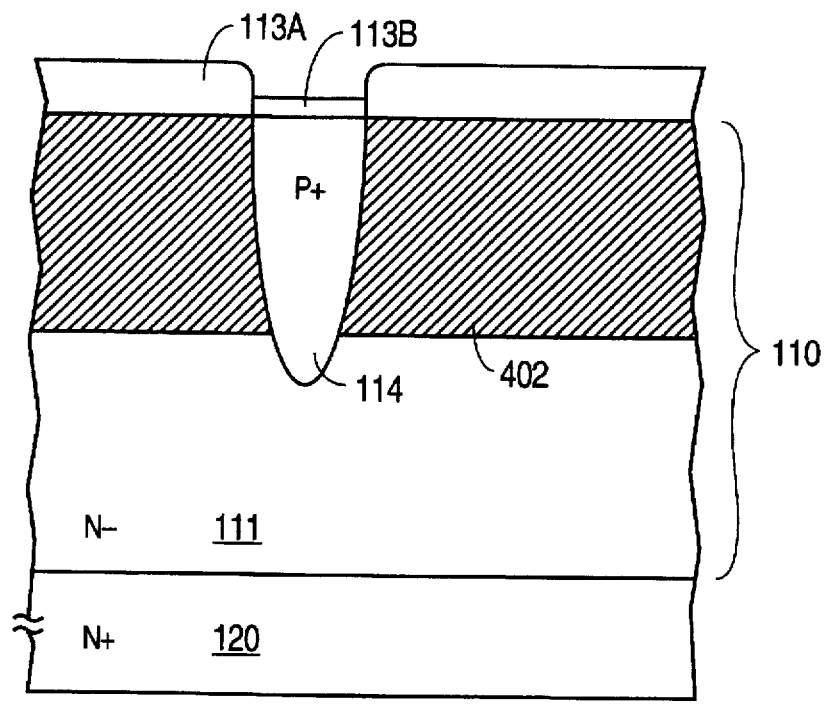

A thick oxide layer 113A and a thin oxide layer 113B are then grown on the top surface of the structure, and deep P+ region 114 is implanted through the thin oxide layer 113B. The resulting structure is illustrated in FIG. 11C. Oxide layers 113A and 113B are then removed.

Figure 11D:
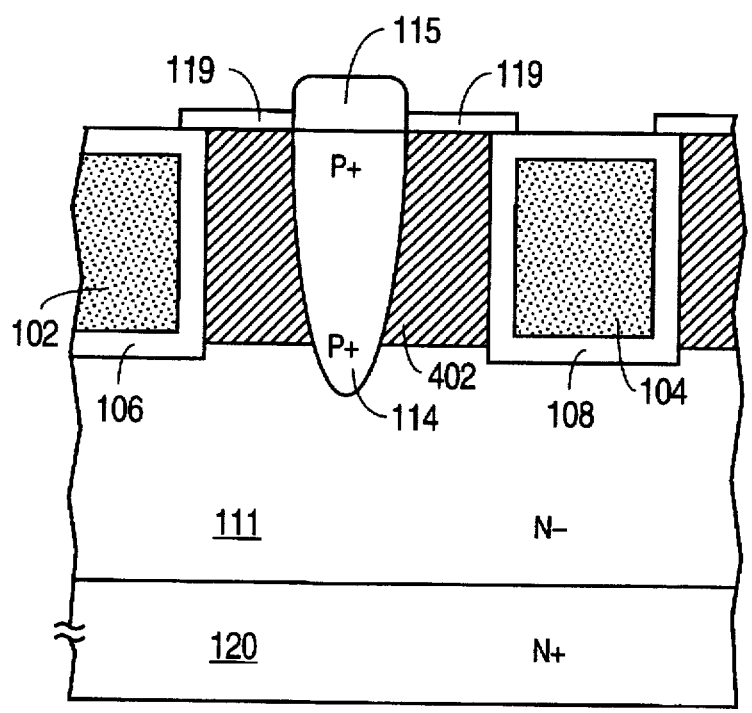

A thick oxide layer 115 is then grown over deep P+ region 114, and a thin oxide layer 119 is grown over remaining portions of the structure except where the trenches are to be formed. The trenches are then etched, and gate oxides 106 and 108 and gates 102 and 104 are formed in accordance with known techniques. The resulting structure is illustrated in FIG. 11D.

Figure 11E:
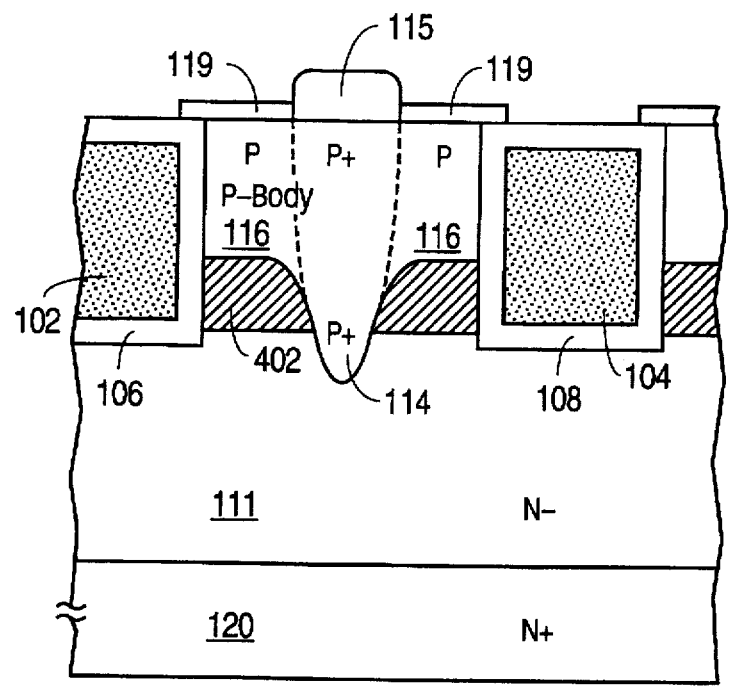
Figure 11F:
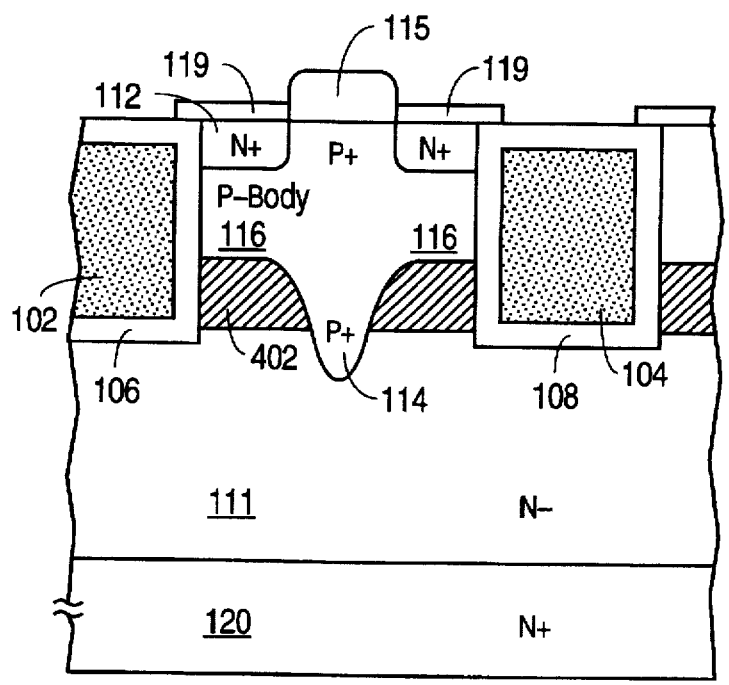
Figure 11G:
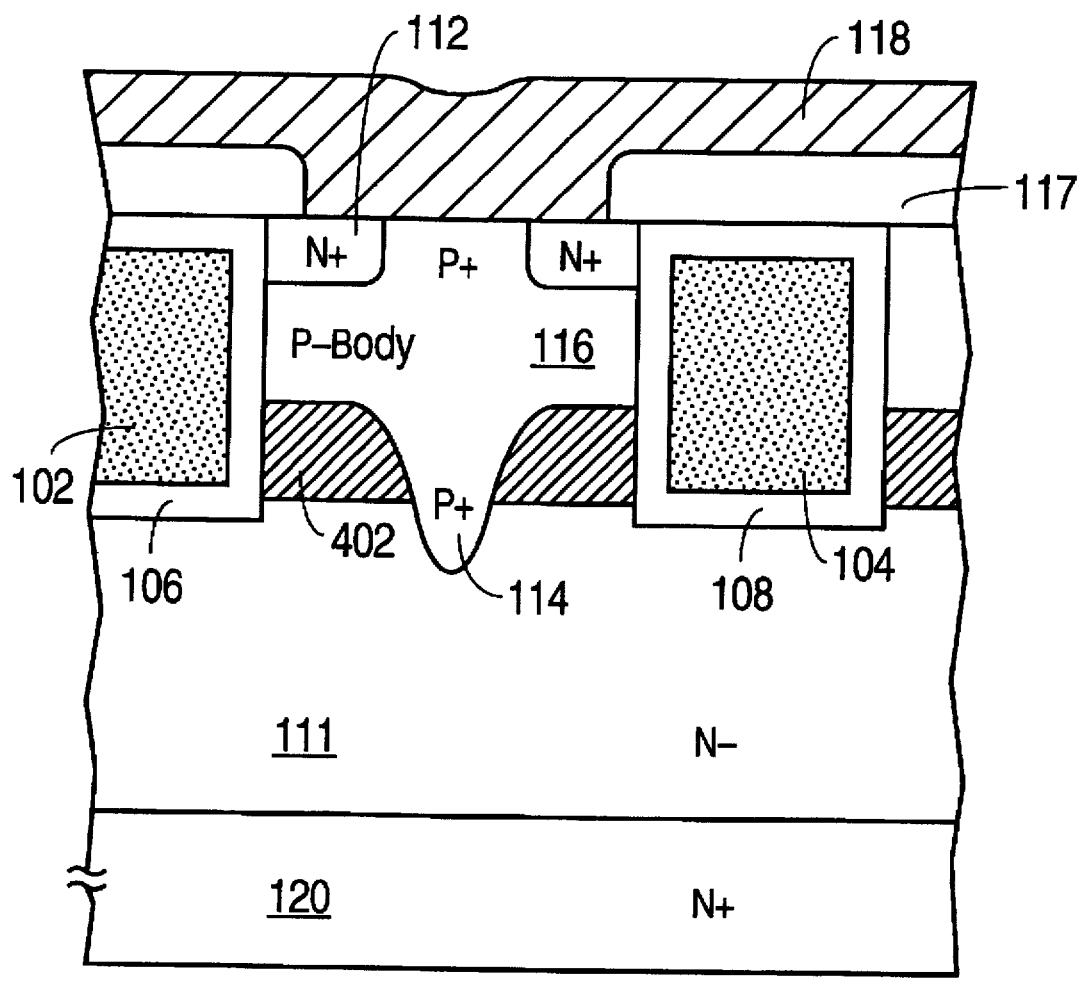

As shown in FIGS. 11E and 11F, P body 116 is then implanted through the thin oxide layer 119 (e.g., boron at a dosage of $3 \times 10^{13}$ cm$^{-2}$ and an energy of 100 Kev), as is the N+ source region 112. Finally oxide layers 115 and 119 are removed. Field oxide 117 is grown, a contact hole is etched in field oxide layer 117, and metal layer 118 is deposited, forming a source/body contact through the contact hole. The oxide may also include a layer of deposited borophosphosilicate glass (BPSG) which is momentarily heated to around 850° to 950° C. to flow smoothly and flatten the surface topology of the die. The resulting structure is shown in FIG. 11G.

Figure 12A:
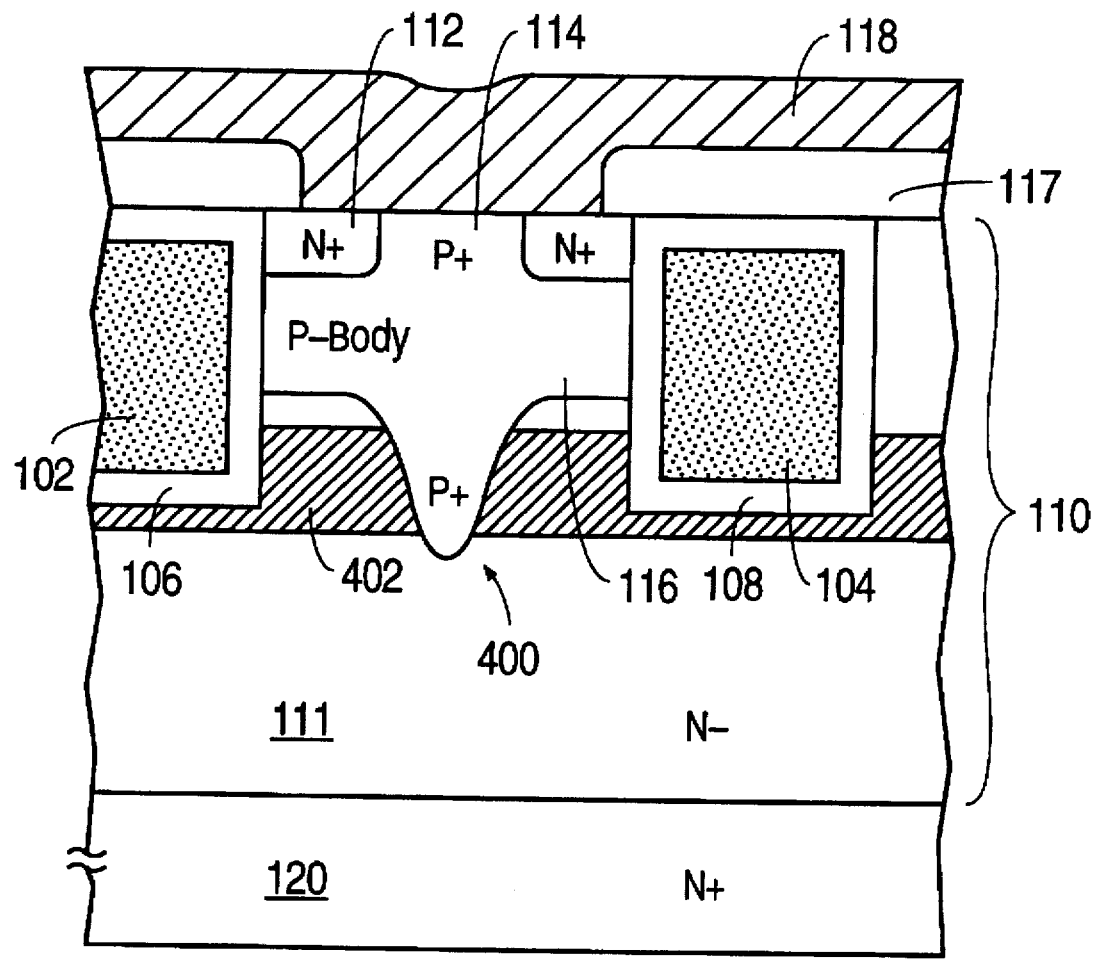
FIG. 12A illustrates an embodiment of a MOSFET with a deep central diffusion and a delta layer which extends below the bottom of the trench but not below the tip of the deep central diffusion.
Figure 12B:
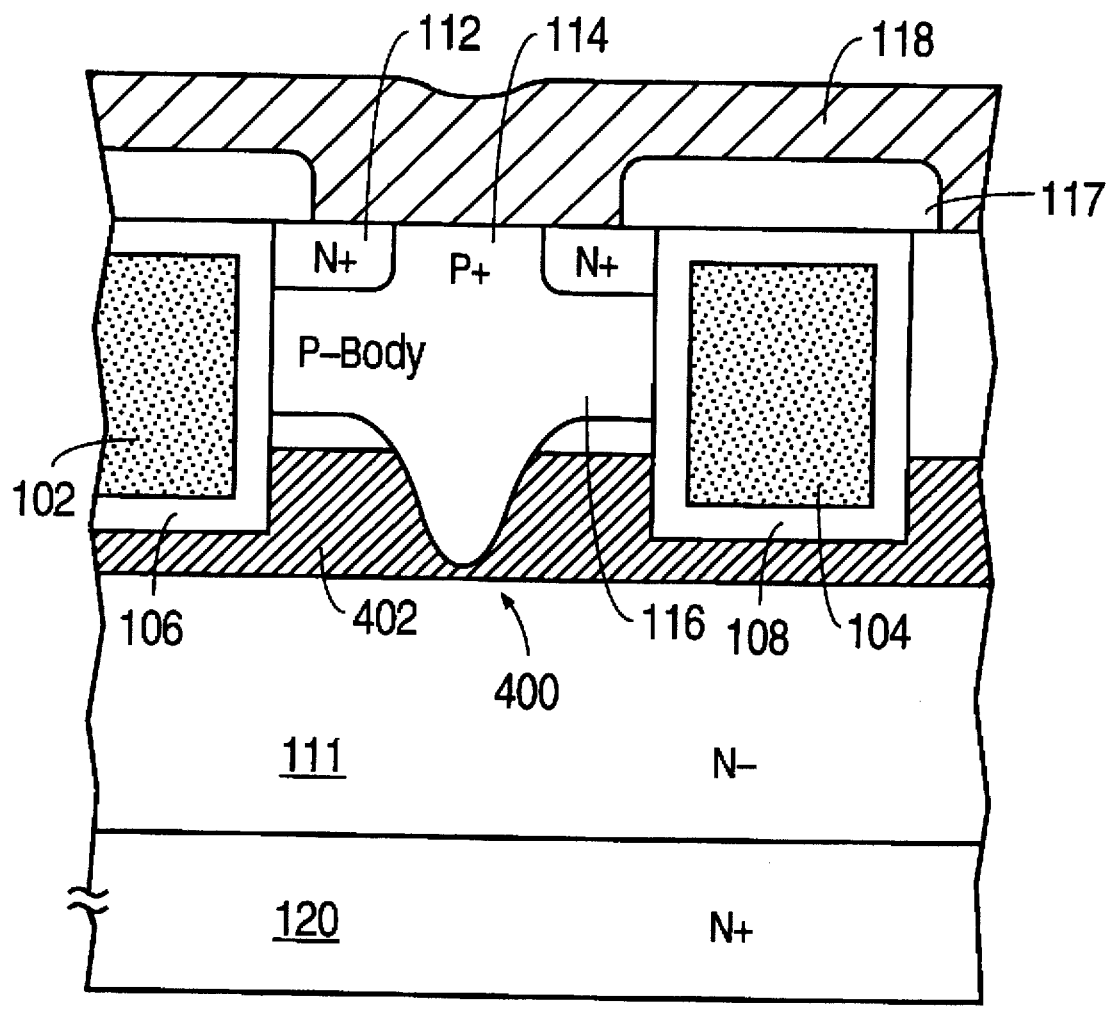
FIG. 12B illustrates an embodiment of a MOSFET with a deep central diffusion and a delta layer which extends below the bottom of the trench and the tip of the deep central diffusion.
Figure 12C:
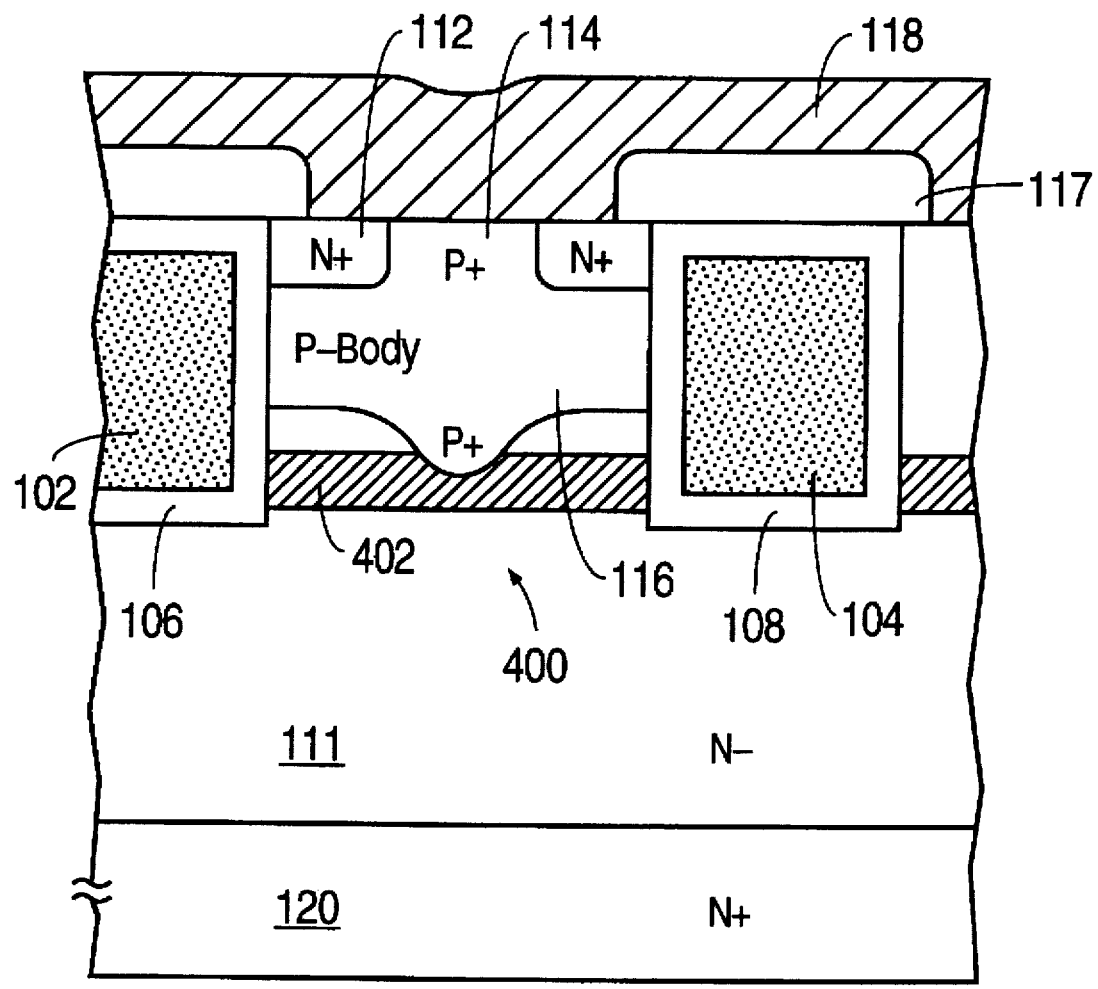
FIG. 12C illustrates an embodiment of a MOSFET with a delta layer which underlies the tip of a relatively shallow central diffusion but does not extend below the bottom of the trench.
Figure 12D:
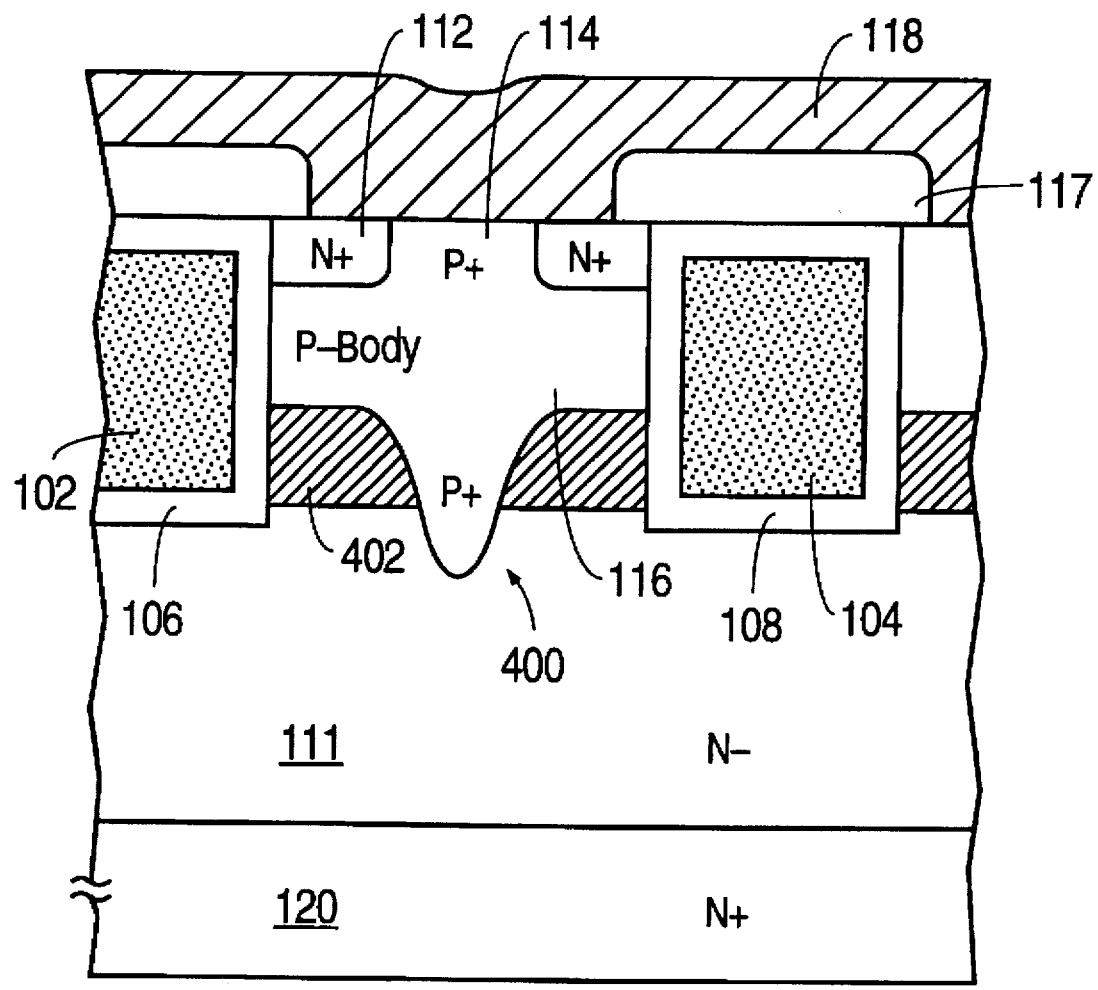
FIG. 12D illustrates an embodiment of a MOSFET having a deep central diffusion and a delta layer which does not extend below the bottom of the trench.
Figure 12E:
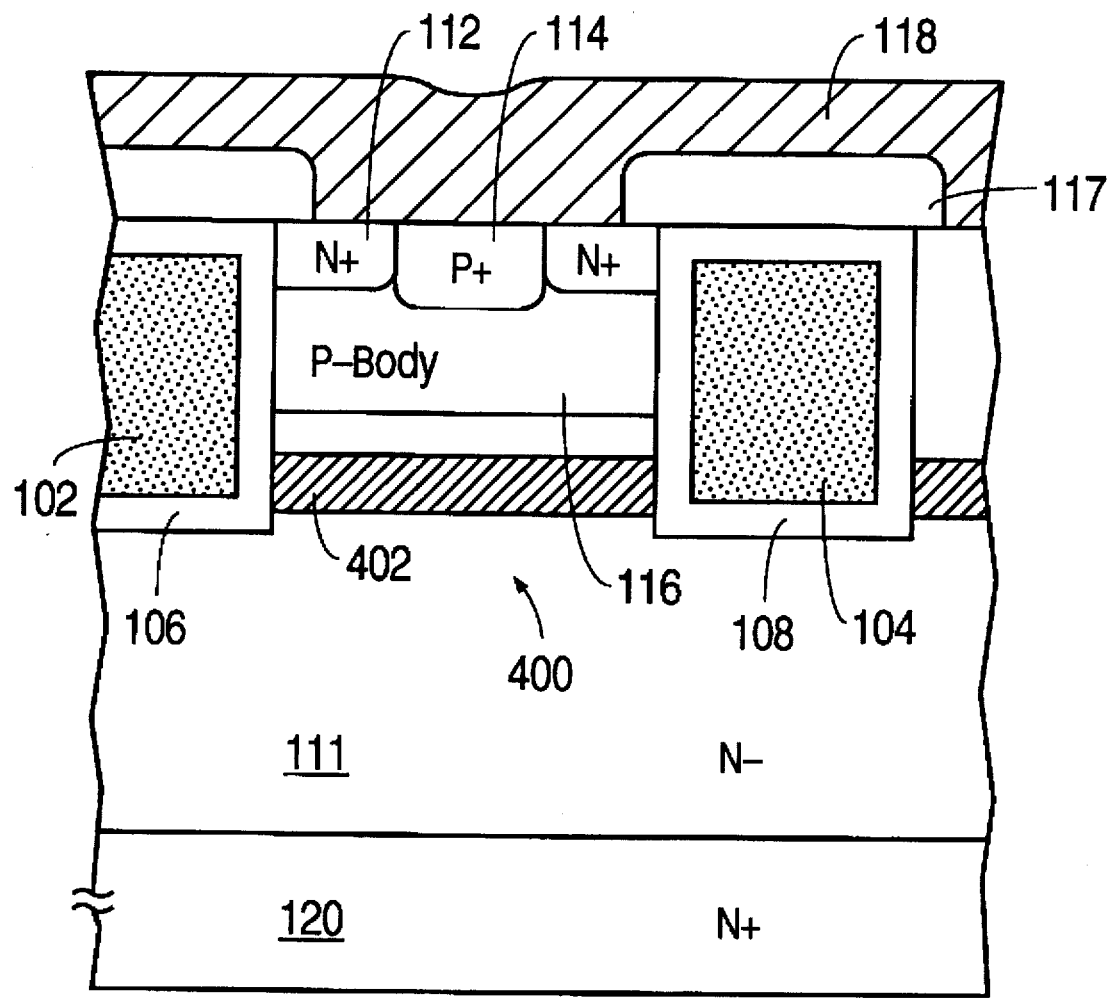
FIG. 12E illustrates an embodiment of a MOSFET without a deep central diffusion and a delta layer which does not extend below the bottom of the trench or to the lower edge of the body region.

A MOSFET according to this invention may be constructed in a wide variety of alternative embodiments. For example, the lower boundary of the delta layer may be at a level below the bottom of the trench (FIGS. 12A and 12B) or it may be at a level above the bottom of the trench (FIGS. 12C and 12D). The deep diffusion at the center of the cell may have a deepest point which is at a level below the bottom of the trench (FIGS. 12A and 12B) or it may be at a level above the bottom of the trench and below the lower junction of the body region (FIG. 12C) or it may consist of a relatively shallow body contact region having a deepest point above the lower junction of the body region (FIG. 12E). The upper boundary of the delta region may coincide with the lower junction of the body region (FIG. 12D) or it may be at a level below the lower junction of the body region (FIGS. 12A, 12B and 12C).

Figure 13A:
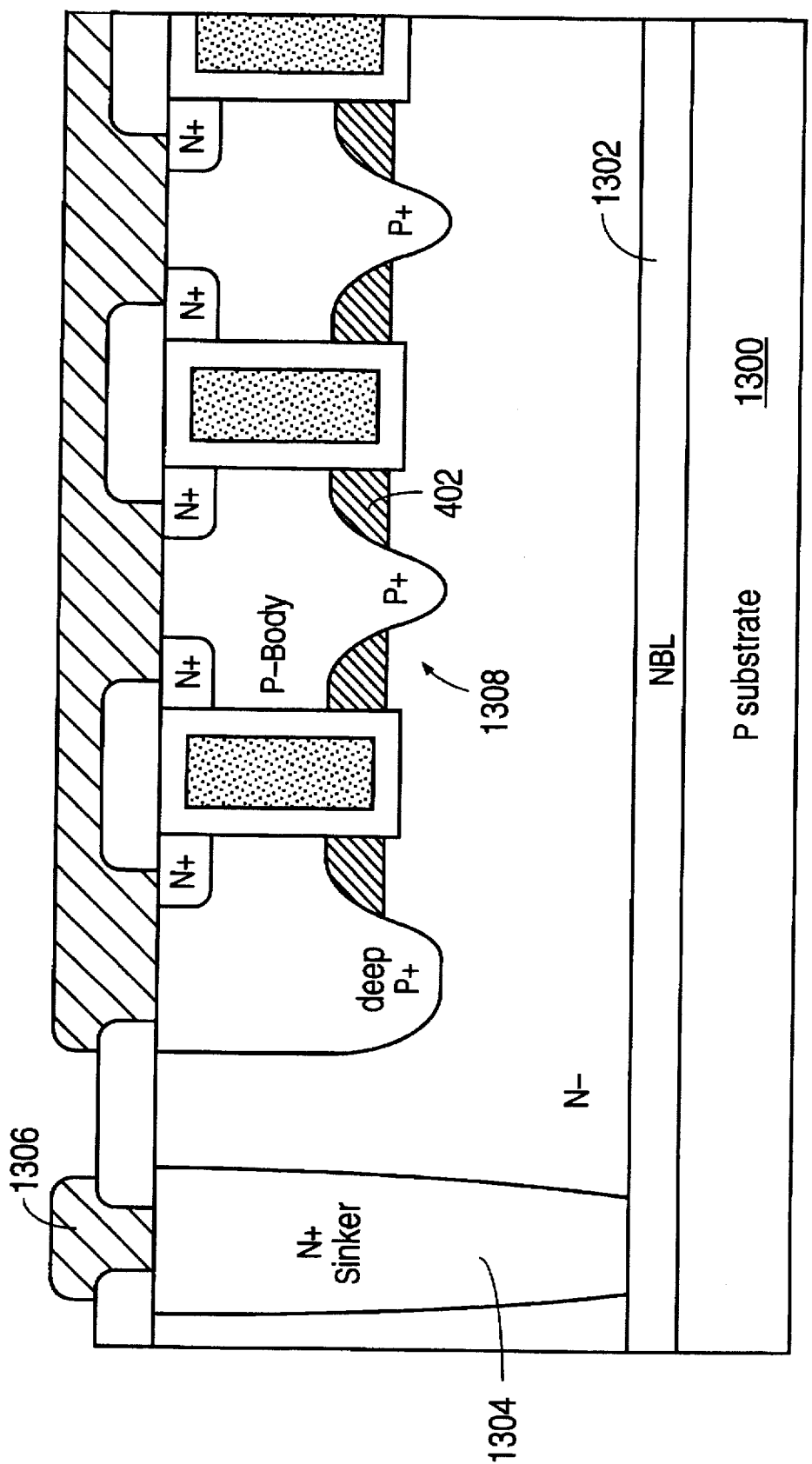
FIGS. 13A and 13B illustrate the application of the principles of this invention to "quasi-vertical" MOSFETs, i.e., vertical trench MOSFETs in which the drain contact is made at the top surface of the device.
Figure 13B:
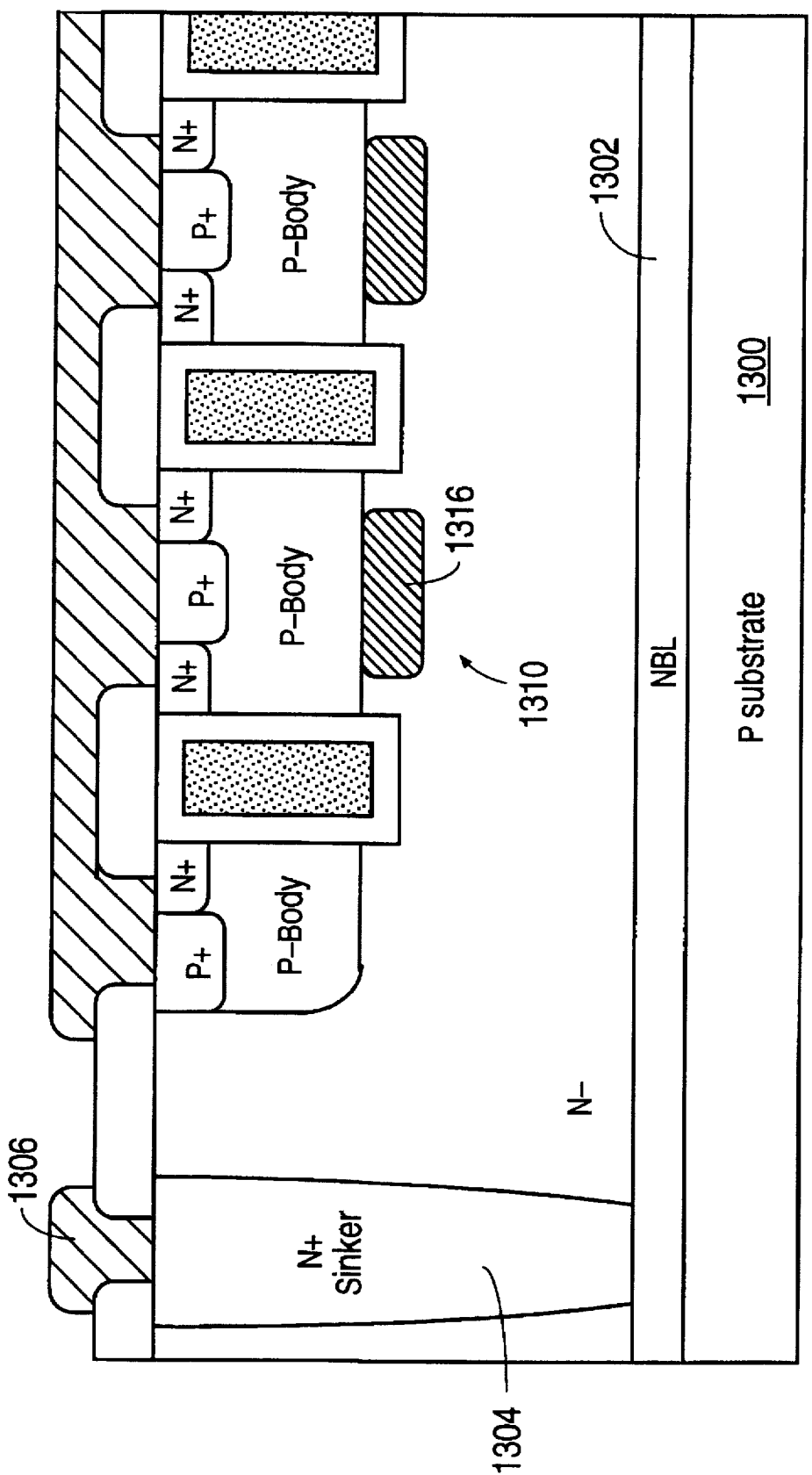

The principles of this invention are also applicable to "quasi vertical" MOSFETs, wherein the drain connection is on the top surface of the device. Two exemplary embodiments are illustrated in FIGS. 13A and 13B, respectively. Both embodiments are formed on a P substrate 1300. An N+ buried layer 1302 is formed at the top surface of P substrate 1300. An N+ sinker 1304 extends downward from a drain metal contact 1306 to N+ buried layer 1302. MOSFET 1308, shown in FIG. 13A, includes a central deep P+ region and is generally similar to the structure of the MOSFET shown in FIG. 12D. MOSFET 1310, shown in FIG. 13B includes a central delta layer 1316 which, like delta layer 802 in FIG. 8, does not extend laterally to the gate oxide.

While the embodiments described above generally include N-channel devices, the principles of this invention are also applicable to P-channel devices.

The broad principles of this invention are defined in the following claims.

We claim:

1. A method of fabricating a vertical trench MOSFET, said method comprising the steps of:

providing a substrate of a first conductivity type;

forming an epitaxial layer of said first conductivity type on a surface of said substrate;

performing a first implant of dopant of said first conductivity type through a top surface of said epitaxial layer so as to form a delta implant region having a dopant concentration greater than a dopant concentration of a remaining portion of said epitaxial layer;

performing a second implant of dopant of a second conductivity type that is opposite to said first conductivity type through said top surface of said epitaxial layer to form a deep diffusion;

after said step of performing a first implant, forming a first trench and a second trench at said top surface, said first and second trenches defining a cell of said MOSFET, said deep diffusion being located in a central region between said first and second trenches, said deep diffusion not being in contact with either said first trench or said second trench;

performing a third implant of dopant of said second conductivity type into said epitaxial layer to form a body implant region;

performing a fourth implant of dopant of said first conductivity type into said epitaxial layer to form a source region; and depositing metal so as to form a contact with said source and body implant regions.

2. The method of claim 1 wherein said first implant is performed with a dosage of $5 \times 10^{13}$ cm$^{-2}$ and at an energy of 120 keV.

3. The method of claim 1 wherein said first implant is performed such that said delta implant region is separated from an edge of said trench.

4. The method of claim 1 wherein said first and third implants are performed at respective energies such that a region of peak dopant concentration of said delta implant region is located below a region of peak dopant concentration of said body implant region.

5. The method of claim 1 wherein said first implant is performed at an energy such that a region of peak dopant concentration in said delta implant region is located at a level above a bottom of said trench.

6. The method of claim 1 wherein said first implant is performed at an energy such that a region of peak dopant concentration of said delta implant region is located at a level below a bottom of said trench.

7. The method of claim 1 wherein a bottom of said trench is approximately 1.5 µm below said top surface.

8. The method according to claim 1 wherein said step of performing a first implant is performed during said step of forming an epitaxial layer.

9. The method according to claim 1 wherein a bottom boundary of said delta implant region is substantially parallel to said surface of said substrate.

10. The method according to claim 1 wherein said step of performing a second implant of dopant is performed after said step of performing a first implant.

11. The method of claim 1 wherein said delta implant has a Q of $2 \times 10^{11}$ cm$^{-2}$ to $1.5 \times 10^{12}$ cm$^{-2}$.

12. The method of claim 1 wherein said first implant is performed at an energy of approximately 120 keV.

13. The method of claim 1 wherein a deepest point of said deep diffusion is approximately 2.5 µm below said top surface.

14. The method of claim 1 wherein said first implant is performed during said formation of said epitaxial layer.

15. A method of fabricating a vertical trench MOSFET, said method comprising the steps of:

providing a substrate of a first conductivity type;

forming an epitaxial layer of said first conductivity type on a surface of said substrate;

providing a mask at a top surface of said epitaxial layer;

performing a first implant of dopant of said first conductivity type through said mask so as to form a delta implant region having a dopant concentration greater than a dopant concentration of a remaining portion of said epitaxial layer;

performing a second implant of dopant of a second conductivity type that is opposite to said first conductivity type through said top surface of said epitaxial layer to form a deep diffusion;

after said step of performing a first implant, forming a first trench and a second trench at said top surface, said first and second trenches defining a cell of said MOSFET, said deep diffusion being located in a central region between said first and second trenches, said deep diffusion not being in contact with either said first trench or said second trench;

performing a third implant of dopant of said second conductivity type into said epitaxial layer to form a body implant region;

performing a fourth implant of dopant of said first conductivity type into said epitaxial layer to form a source region; and depositing metal so as to form a contact with said source and body implant regions.

16. A method of fabricating a vertical trench MOSFET, said method comprising the steps of:

providing a substrate of a first conductivity type;

forming an epitaxial layer of said first conductivity type on a surface of said substrate;

providing a mask at a top surface of said epitaxial layer;

performing an implant of dopant of said first conductivity type through said mask so as to form a delta implant region having a dopant concentration greater than a dopant concentration of a remaining portion of said epitaxial layer;

performing a second implant of dopant of a second conductivity type that is opposite to said first conductivity type through said top surface of said epitaxial layer to form a deep diffusion;

defining an active region at said top surface of said epitaxial layer;

forming a trench at said top surface adjacent said active region wherein said mask is configured such that said delta implant region is separated from said trench;

performing a third implant of dopant of said second conductivity type into said epitaxial layer to form a body implant region;

performing a fourth implant of dopant of said first conductivity type into said epitaxial layer to form a source region; and depositing metal so as to form a contact with said source and body implant regions.

* * * * *